(12) United States Patent
Bryant et al.

(10) Patent No.: US 8,232,627 B2
(45) Date of Patent: Jul. 31, 2012

(54) INTEGRATED CIRCUIT DEVICE WITH SERIES-CONNECTED FIELD EFFECT TRANSISTORS AND INTEGRATED VOLTAGE EQUALIZATION AND METHOD OF FORMING THE DEVICE

(75) Inventors: Andres Bryant, Burlington, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 195 days.

(21) Appl. No.: 12/563,195

(22) Filed: Sep. 21, 2009

(65) Prior Publication Data

US 2011/0068399 A1 Mar. 24, 2011

(51) Int. Cl.
*H01L 29/06* (2006.01)
(52) U.S. Cl. .... 257/623; 257/67; 257/353; 257/E21.377
(58) Field of Classification Search .............. 257/67, 257/288, 353, 618, 623, E21.377; 438/39, 438/164, 412
See application file for complete search history.

(56) References Cited

U.S. PATENT DOCUMENTS

| | | | |
|---|---|---|---|
| 4,152,716 A | 5/1979 | Torii et al. | |
| 5,780,347 A | 7/1998 | Kapoor | |
| 5,834,807 A | 11/1998 | Kim | |
| 6,967,398 B2 | 11/2005 | Frech et al. | |
| 7,088,971 B2 | 8/2006 | Burgener et al. | |
| 7,177,619 B2 | 2/2007 | Nowak | |
| 7,248,120 B2 | 7/2007 | Burgener et al. | |
| 7,307,467 B2 | 12/2007 | Goodnow et al. | |
| 7,314,786 B1 | 1/2008 | Yang et al. | |
| 2002/0097598 A1 | 7/2002 | Hoenigschmid | |
| 2006/0091468 A1* | 5/2006 | Liaw | 257/368 |
| 2006/0214238 A1 | 9/2006 | Glass et al. | |
| 2006/0270367 A1 | 11/2006 | Burgener et al. | |
| 2006/0278927 A1 | 12/2006 | Park et al. | |
| 2007/0040221 A1 | 2/2007 | Gossner et al. | |
| 2010/0155846 A1* | 6/2010 | Mukherjee et al. | 257/365 |
| 2011/0111565 A1* | 5/2011 | Nawaz | 438/157 |
| 2011/0151651 A1* | 6/2011 | Xiong et al. | 438/486 |

FOREIGN PATENT DOCUMENTS

JP 3226117 A 10/1991

OTHER PUBLICATIONS

Anderson et al., U.S. Appl. No. 12/563,194, Application filed Sep. 21, 2009.

* cited by examiner

*Primary Examiner* — Evan Pert
*Assistant Examiner* — Eduardo A Rodela
(74) *Attorney, Agent, or Firm* — Gibb & Riley, LLC; Anthony J. Canale

(57) ABSTRACT

Disclosed is an integrated circuit device having series-connected planar or non-planar field effect transistors (FETs) with integrated voltage equalization and a method of forming the device. The series-connected FETs comprise gates positioned along a semiconductor body to define the channel regions for the series-connected FETs. Source/drain regions are located within the semiconductor body on opposing sides of the channel regions such that each portion of the semiconductor body between adjacent gates comprises one source/drain region for one field effect transistor abutting another source/drain region for another field effect transistor. Integrated voltage equalization is achieved through a conformal conductive layer having a desired resistance and positioned over the series-connected FETs such that it is electrically isolated from the gates, but in contact with the source/drain regions within the semiconductor body.

20 Claims, 19 Drawing Sheets

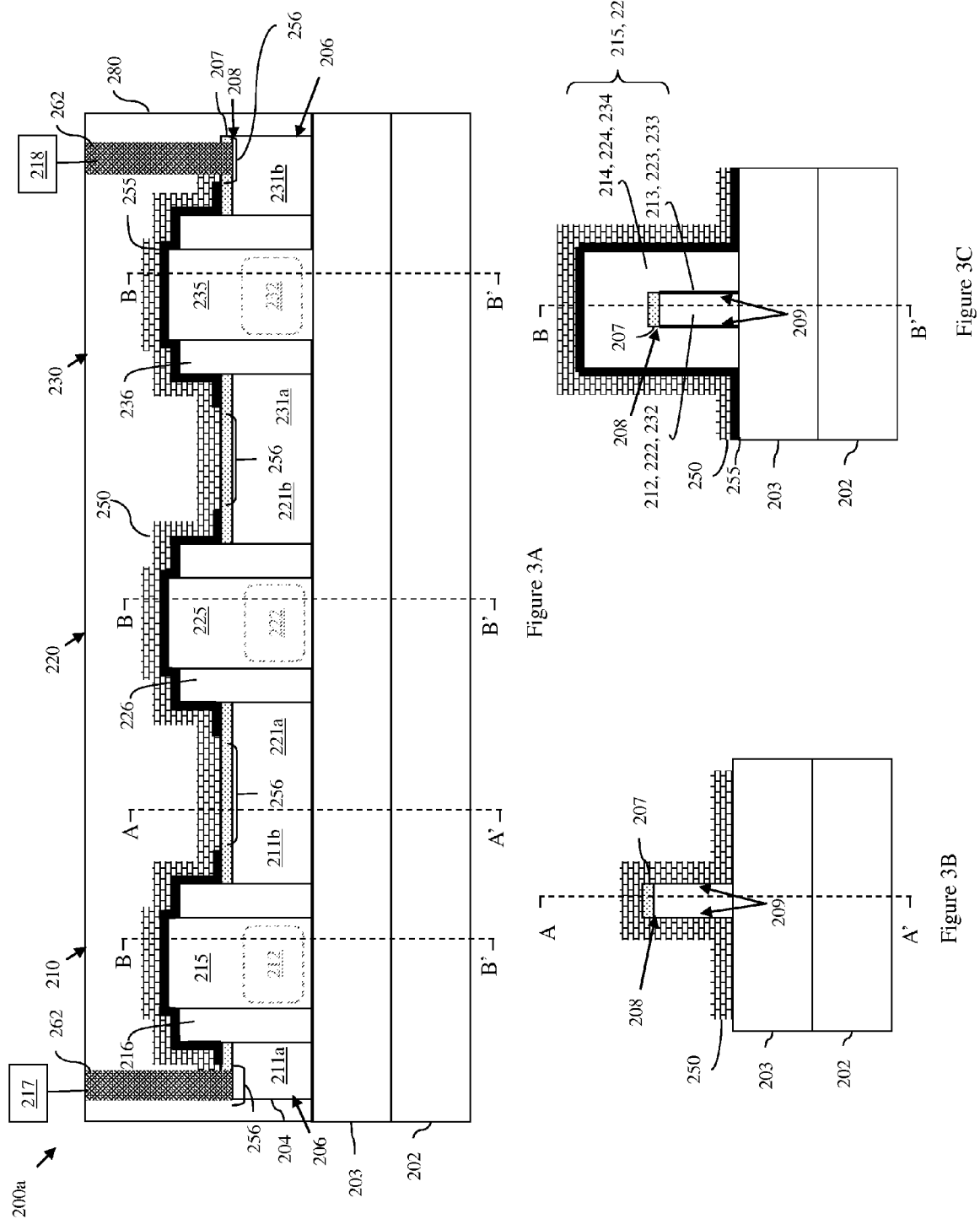

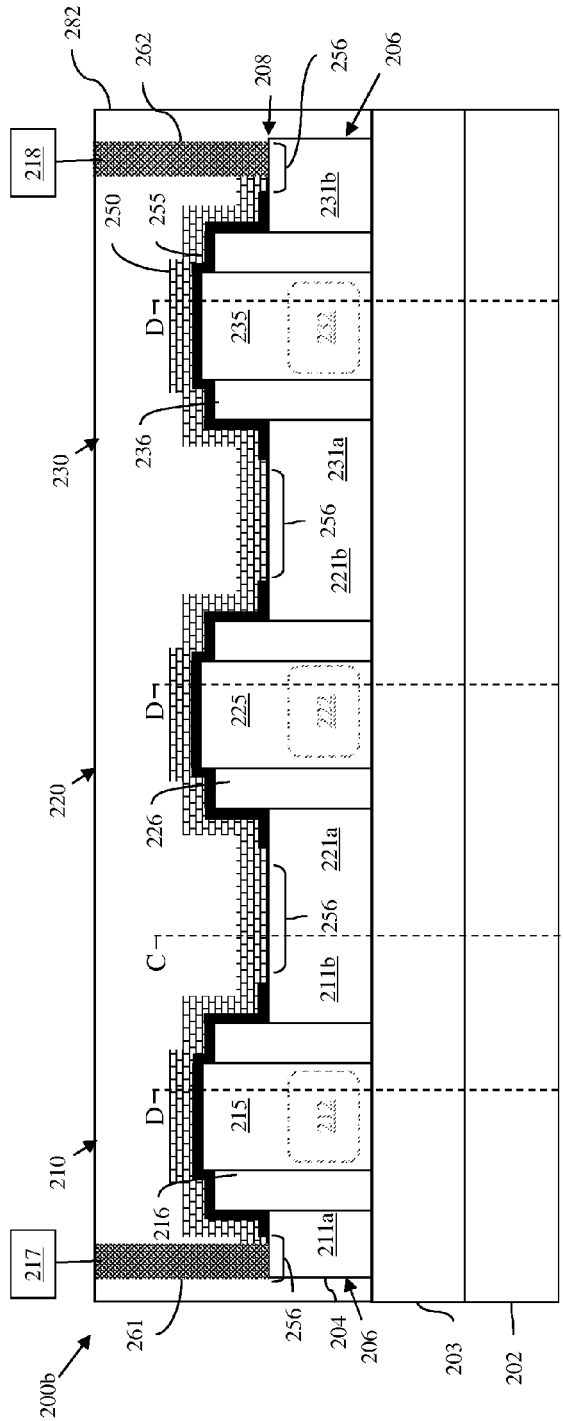
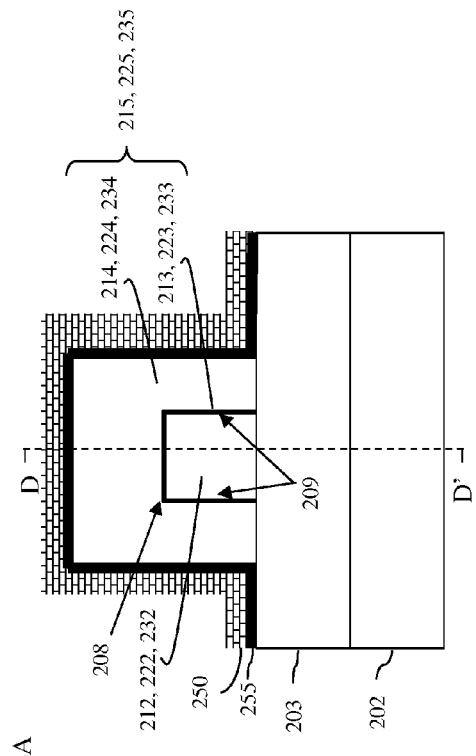
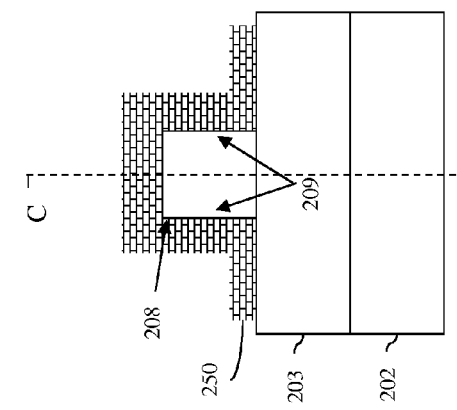
Figure 4A
Figure 4B
Figure 4C

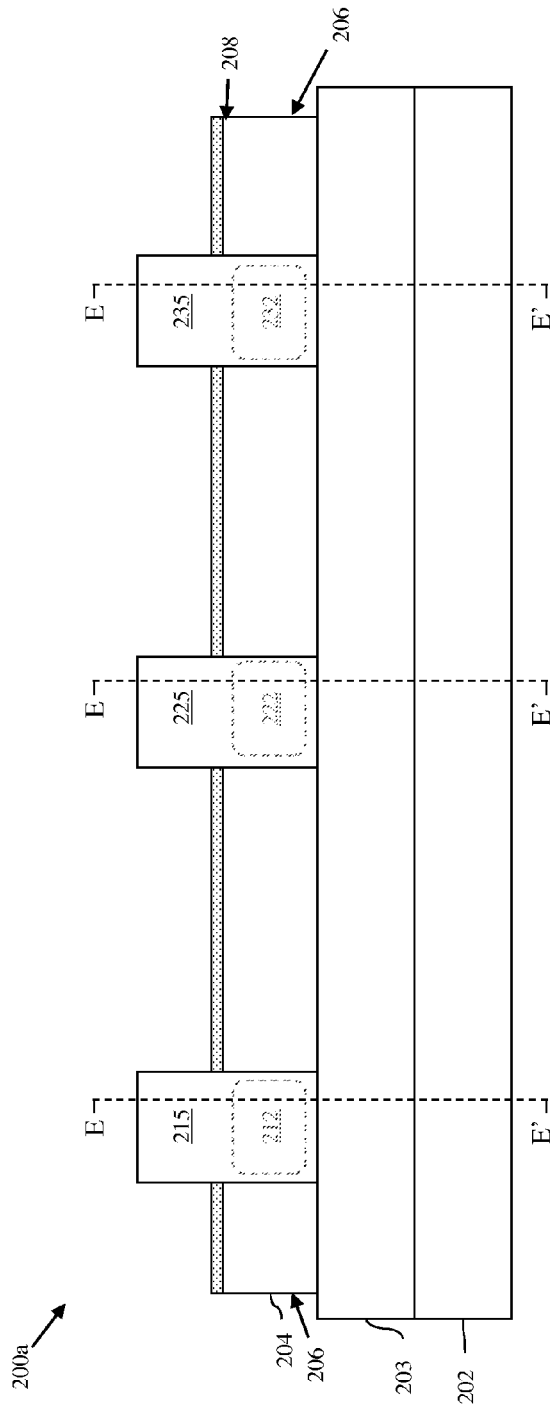
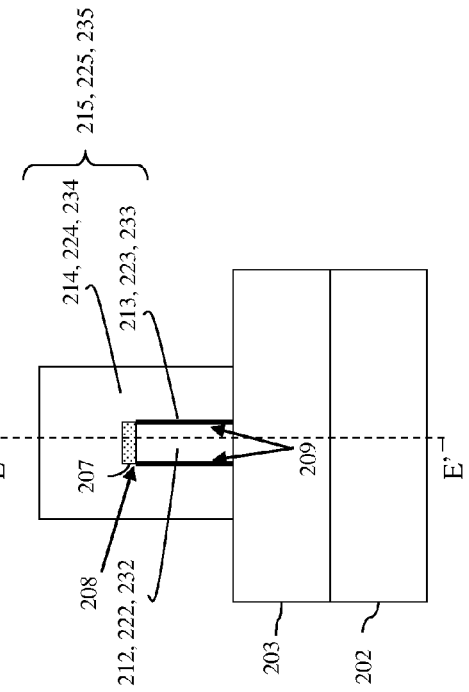
Figure 20A
Figure 20B

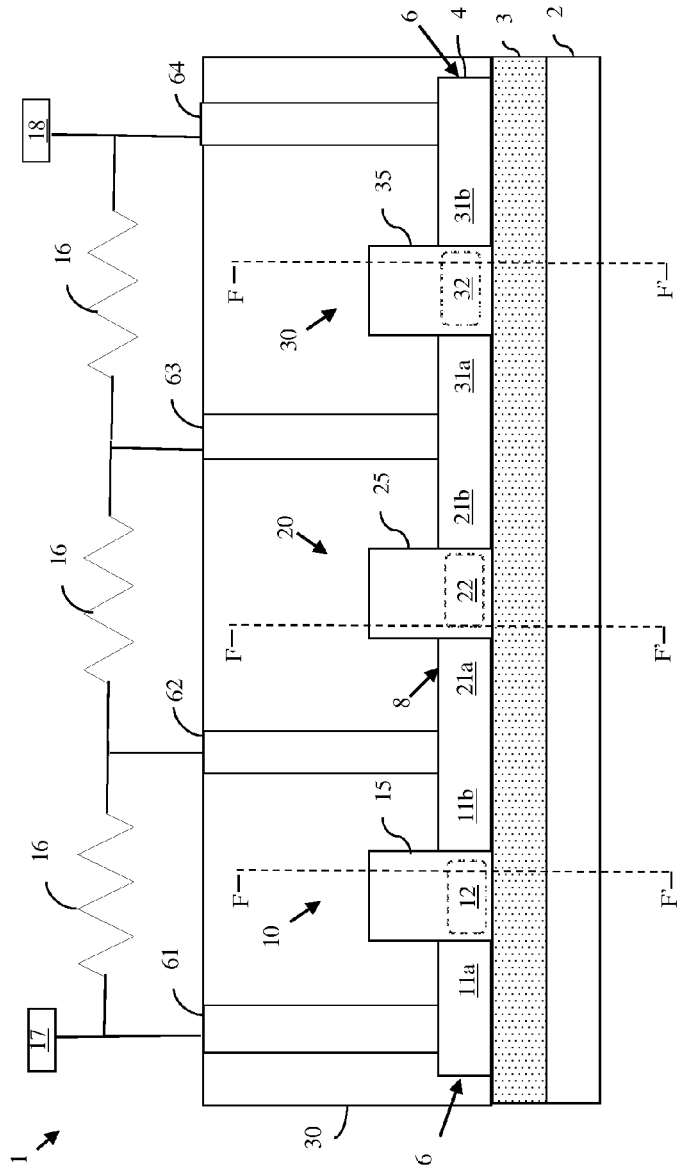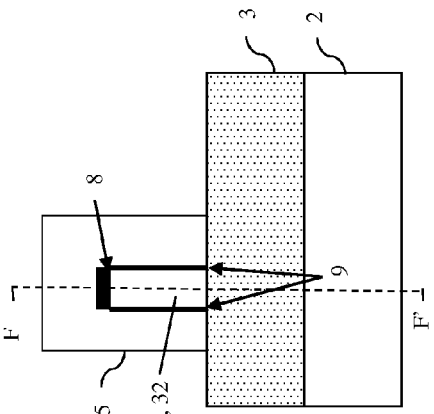
Figure 25A
Figure 25B

INTEGRATED CIRCUIT DEVICE WITH SERIES-CONNECTED FIELD EFFECT TRANSISTORS AND INTEGRATED VOLTAGE EQUALIZATION AND METHOD OF FORMING THE DEVICE

BACKGROUND

1. Field of the Invention

The embodiments of the invention generally relate to integrated circuit devices having series-connected field effect transistors (FETs) and, more specifically, to an integrated circuit device, such as a radio frequency (RF) switch, having series-connected planar or non-planar FETs and integrated voltage equalization.

2. Description of the Related Art

Integrated circuit design decisions are often driven by device scalability and manufacturing efficiency.

For example, because size scaling of planar field effect transistors (FETs) resulted in reduced drive current as a function of reduced channel width, multi-gate non-planar field effect transistors (MUGFETs) (e.g., dual-gate FETs and tri-gate FETs) were developed to provide scaled devices with increased drive current and reduced short channel effects. Dual-gate FETs (also referred to as fin-type FETs or FINFETs) are non-planar FETs in which a fully depleted channel region is formed in the center of a relatively thin semiconductor fin with source and drain regions in the opposing ends of the fin adjacent to the channel region. A gate is formed over the top surface and on each side of the thin fin in an area corresponding to the channel region to provide two-dimensional field effects. A dielectric cap layer (such as a nitride cap layer) typically isolates the top surface of the channel region from the gate so that only two-dimensional field effects are exhibited. The effective channel width is determined by the fin height. Additionally, a fin thickness of approximately one-half (or less) the length of the gate can ensure suppression of deleterious short-channel effects, such as variability in threshold voltage and excessive drain leakage currents. Tri-gate FETs are similar in structure to FINFETs, except that the fin of a tri-gate FET is wider and devoid of a dielectric cap layer. Thus, the gate, which is formed over the top surface and on each side of the fin, causes three-dimensional field effects to be exhibited. Typically, the fin height to width ratio in a tri-gate FET is in the range of 3:2 to 2:3 so that the channel will remain fully depleted and so that the resulting three-dimensional field effects will provide greater device drive current and improved short-channel characteristics over a planar transistor. The effective channel width of MUGFETs and, thereby, the device drive current can be increased by using multiple semiconductor fins.

Additionally, because size scaling of field effect transistors (FETs), including both planar FETs and non-planar FETs, has resulted in limits on the maximum source-to-drain voltage that any single FET can reliably switch, FET networks with multiple series-connected FETs were developed in order to support the switching of higher source-to-drain voltages. In such FET networks, the series-connected FETs are also often connected in parallel to a discrete voltage distribution network in order to ensure uniform voltage distribution and, thereby to avoid breakdown run-away, when the FETs are in the off-state, and have a large voltage across the entire series network of FETs.

SUMMARY

Disclosed are embodiments of an integrated circuit device having series-connected planar FETs with integrated voltage equalization. In these embodiments, multiple gates can be positioned on the top surface of a semiconductor layer, thereby defining channel regions within the semiconductor layer for multiple series-connected planar FETs. Source/drain regions can be located within the semiconductor layer on opposing sides of each of the channel regions such that each portion of the semiconductor layer between adjacent gates contains one source/drain region for one field effect transistor abutting another source/drain region for another field effect transistor. Integrated voltage equalization is achieved through a conformal conductive layer having a desired resistance and positioned over the series-connected FETs such that it is electrically isolated from the gates, but in contact with the source/drain regions.

Disclosed are embodiments of an integrated circuit device having series-connected non-planar FETs with integrated voltage equalization. In these embodiments, a semiconductor fin can be positioned on an isolation layer. Multiple gates can be positioned along the fin and can define channel regions in the semiconductor fin for multiple non-planar FETs connected in a series. Source/drain regions can be located within the semiconductor fin on opposing sides of each of the channel regions such that each portion of the semiconductor fin between adjacent gates comprises one source/drain region for one field effect transistor abutting another source/drain region for another field effect transistor. Integrated voltage equalization is achieved through a conformal conductive layer having a desired resistance and positioned over the series-connected FETs such that it is electrically isolated from the gates, but in contact with the source/drain regions.

Also disclosed are embodiments of a method of forming an integrated circuit device having series-connected planar FETs with integrated voltage equalization. In these embodiments, multiple gates can be formed on the top surface of a semiconductor layer, thereby defining channel regions in the semiconductor layer for multiple series-connected planar FETs. After the gates are formed, source/drain regions can be formed within the semiconductor layer on opposing sides of each of the channel regions such that each portion of the semiconductor layer between adjacent gates comprises one source/drain region for one field effect transistor abutting another source/drain region for another field effect transistor. Subsequently, a conformal conductive layer having a desired resistance can be formed over the series-connected planar FETs and, particularly, over the gates and over the source/drain regions in the semiconductor layer such that it is electrically isolated from the gates, but in contact with the source/drain regions.

Also disclosed are embodiments of a method of forming an integrated circuit device having series-connected non-planar FETs with integrated voltage equalization. In these embodiments, a semiconductor fin can be formed on an isolation layer. Then, multiple gates can be formed on the semiconductor fin, thereby defining channel regions in the semiconductor fin for multiple series-connected non-planar FETs. After the gates are formed, source/drain regions can be formed within the semiconductor fin on opposing sides of each of the channel regions such that each portion of the semiconductor fin between adjacent gates comprises one source/drain region for one field effect transistor abutting another source/drain region for another field effect transistor. Subsequently, a conformal conductive layer having a desired resistance can be formed over the series-connected non-planar FETs and, particularly, over the gates and over the source/drain regions in the semiconductor fin such that it is electrically isolated from the gates and in contact with the source/drain regions.

BRIEF DESCRIPTION OF THE SEVERAL VIEWS OF THE DRAWINGS

The embodiments of the invention will be better understood from the following detailed description with reference to the drawings, which are not necessarily drawing to scale and in which:

FIG. 3A is a schematic drawing illustrating an embodiment 200a of an integrated circuit device having series-connected dual-gate FETs with integrated voltage equalization;

FIG. 3B is a schematic diagram illustrating a cross-section A-A' through the device of FIG. 3A;

FIG. 3C is a schematic diagram illustrating cross-sections B-B' through the device of FIG. 3A;

FIG. 4A is a schematic drawing illustrating an embodiment 200b of an integrated circuit device having series-connected tri-gate FETs with integrated voltage equalization;

FIG. 4B is a schematic diagram illustrating a cross-section C-C' through the device of FIG. 4A;

FIG. 4C is a schematic diagram illustrating cross-sections D-D' through the device of FIG. 4A;

FIG. 20A is a schematic drawing illustrating a partially completed structure formed according to the method of FIG. 17;

FIG. 20B is a schematic diagram illustrating a cross-section E-E' through the structure of FIG. 20A;

FIG. 25A is a schematic drawing illustrating an integrated circuit device having series-connected dual-gate FETs with a discrete voltage distribution network; and FIG. 25B is a schematic diagram illustrating a cross-section F-F' through the device of FIG. 3A.

DETAILED DESCRIPTION

Figure 1:
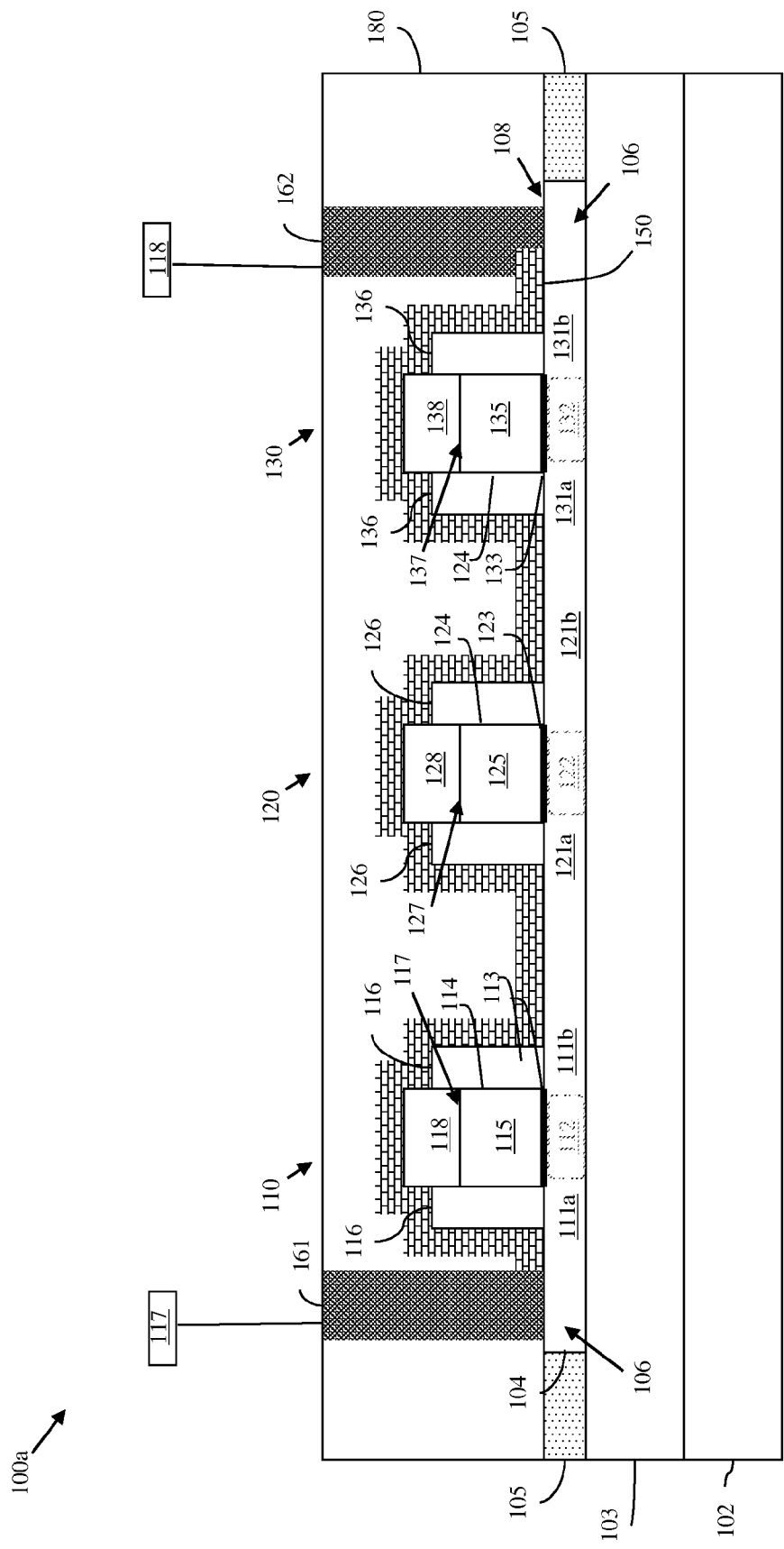
FIG. 1 is a schematic drawing illustrating an embodiment 100a of an integrated circuit device having series-connected planar field effect transistors (FETs) with integrated voltage equalization.

The embodiments of the invention and the various features and advantageous details thereof are explained more fully with reference to the non-limiting embodiments that are illustrated in the accompanying drawings and detailed in the following description.

Integrated circuit design decisions are often driven by device scalability and manufacturing efficiency.

For example, because size scaling of planar field effect transistors (FETs) resulted in reduced drive current as a function of reduced channel width, multi-gate non-planar field effect transistors (MUGFETs) (e.g., dual-gate FETs and tri-gate FETs) were developed to provide scaled devices with increased drive current and reduced short channel effects. Dual-gate FETs (also referred to as fin-type FETs or FIN-FETs) are non-planar FETs in which a fully depleted channel region is formed in the center of a relatively thin semiconductor fin with source and drain regions in the opposing ends of the fin adjacent to the channel region. A gate is formed over the top surface and on each side of the thin fin in an area corresponding to the channel region to provide two-dimensional field effects. A dielectric cap layer (such as a nitride cap layer) typically isolates the top surface of the channel region from the gate so that only two-dimensional field effects are exhibited. The effective channel width is determined by the fin height. Additionally, a fin thickness of approximately one-half (or less) the length of the gate can ensure suppression of deleterious short-channel effects, such as variability in threshold voltage and excessive drain leakage currents. Tri-gate FETs are similar in structure to FINFETs, except that the fin of a tri-gate FET is wider and devoid of a dielectric cap layer. Thus, the gate, which is formed over the top surface and on each side of the fin, causes three-dimensional field effects to be exhibited. Typically, the fin height to width ratio in a tri-gate FET is in the range of 3:2 to 2:3 so that the channel will remain fully depleted and so that the resulting three-dimensional field effects will provide greater device drive current and improved short-channel characteristics over a planar transistor. The effective channel width of MUGFETs and, thereby, the device drive current can be increased by using multiple semiconductor fins.

Additionally, because size scaling of field effect transistors (FETs), including both planar FETs and non-planar FETs, has resulted in limits on the maximum source-to-drain voltage that any single FET can reliably switch, FET networks with multiple series-connected FETs were developed in order to support the switching of higher source-to-drain voltages. In such FET networks, the series-connected FETs are also often connected in parallel to a discrete voltage distribution network in order to ensure uniform voltage distribution and, thereby to avoid breakdown run-away.

FIG. 25A shows an integrated circuit device 1 having multiple series-connected non-planar (FETs) and, more particularly, multiple fin-type field effect transistors (FINFETs) 10, 20, 30 connected in parallel to a discrete voltage distribution network. Specifically, the device 1 comprises a semiconductor fin 4 (i.e., a relatively thin rectangular-shaped semiconductor body) positioned on an isolation layer 3 (e.g., a buried oxide (BOX) layer, doped semiconductor layer, or other suitable isolation layer) above a semiconductor substrate 2. In each FINFET 10, 20, 30, a gate 15, 25, 35 positioned on the opposing sidewalls 9 and across the top surface 8 of the semiconductor fin 4 defines a corresponding channel region 12, 22, 32 (e.g., see FIG. 25B). Additionally, within the semiconductor fin 4, each of the channel regions 12, 22, 32 are positioned between source/drain regions 11a-b, 21a-b, 31a-b, respectively. Thus, the portions of the semiconductor fin 4 between adjacent gates (e.g., between gates 15 and 25 or between gates 25 and 35) are shared source/drain regions. That is, they contain a source/drain region of one FINFET abutting a source/drain region of another.

The voltage distribution network is made up of multiple contacts 61-64 that drop to the opposing ends 6 of the semiconductor fin 4 and also to each of the shared source/drain regions (e.g., shared source/drain regions 11b and 21a and shared source/drain regions 21b and 31a) between adjacent gates. These contacts 61-64 are electrically connected by equalization resistors 16 comprising, for example, high resistance conductive wires in the first metallization layer (M1). The first and last of these contacts 61 and 64 are further connected to different supply voltages 17 and 18 (e.g., Vdd and Vss). Unfortunately, in this configuration, the discrete voltage distribution network and, particularly, the contacts 61-64, the wires connecting the contacts 61-64 to the equalization resistors 16 and the equalization resistors 16 themselves, add capacitive paths from the semiconductor fin 4 to the substrate 2, degrading isolation in the FET network and, thereby degrading performance.

In view of the foregoing, disclosed herein are embodiments of an integrated circuit device, e.g., a radio frequency (RF) switch, having series-connected planar or non-planar field effect transistors (FETs) with integrated voltage equalization rather than a discrete voltage distribution network. The series-connected FETs comprise gates positioned along a semiconductor body (e.g., along a semiconductor layer for series-connected planar FETs or a semiconductor fin for series-connected non-planar FETs) to define the channel regions for the series-connected FETs. Source/drain regions are located within the semiconductor body on opposing sides of the channel regions such that each portion of the semiconductor body between adjacent gates comprises one source/drain region for one field effect transistor abutting another source/drain region for another field effect transistor. Integrated voltage equalization is achieved through a conformal conductive layer having a desired resistance and positioned over the series-connected FETs such that it is electrically isolated from the gates, but in contact with the source/drain regions within the semiconductor body. Also, disclosed herein are embodiments of an associated method of forming such a device.

Figure 2:
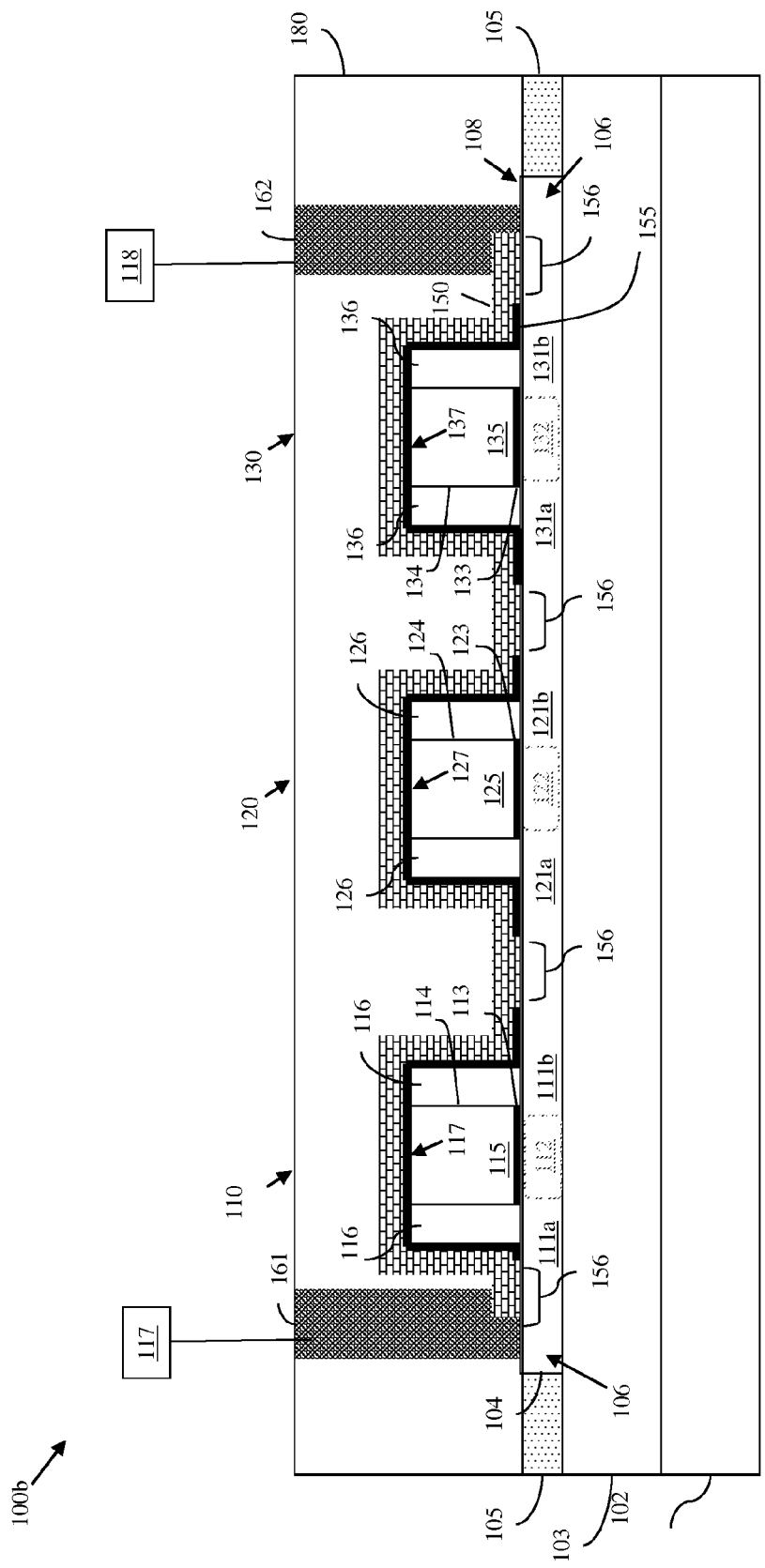
FIG. 2 is a schematic drawing illustrating another embodiment 100b of an integrated circuit device having series-connected planar FETs with integrated voltage equalization.

More particularly, FIGS. 1 and 2 show different embodiments 100a, 100b of a device having two or more series-connected planar FETs (i.e., multiple stacked planar FETs) with integrated voltage equalization. For illustration purposes, the device is shown in FIGS. 1 and 2 as having three series-connected planar FETs 110, 120, and 130.

The device can comprise a semiconductor layer 104. Specifically, the device can be formed on a semiconductor-on-insulator (SOI) wafer such that it comprises a semiconductor substrate 102 (e.g., a silicon (Si) substrate), an insulator layer 103 (e.g., a buried oxide (BOX) layer, a doped semiconductor layer or any other suitable insulator layer) above the semiconductor substrate 102 and a semiconductor layer 104 (e.g., a silicon (Si) layer, a silicon germanium (SiGe) layer or any other suitable semiconductor layer) above the insulator layer 103. Alternatively, the device can be formed on a bulk semiconductor wafer, such as a bulk silicon wafer (not shown).

Isolation regions 105 (e.g., shallow trench isolation (STI) regions) can be positioned laterally adjacent to the semiconductor layer 104 and can define the active region of the multiple planar series-connected FETs 110, 120, 130.

Multiple gates 115, 125, 135 can be positioned along the top surface 108 of the semiconductor layer 104, thereby defining, within the semiconductor layer 104, corresponding channel regions 112, 122, 132 for the multiple planar series-connected FETs 110, 120, 130. These gates 115, 125, 135 can be separated by a predetermined distance and each gate 115, 125, 135 can comprise a gate dielectric layer 113, 123, 133 on the top surface 108 of the semiconductor layer 104 and a gate conductor layer 114, 124, 134 above the gate dielectric layer 113, 123, 133.

Source/drain regions 111a-b, 121a-b, 131a-b can be located within the semiconductor layer 104 on opposing sides of each of the channel regions 112, 122, 132 such that the portions of the semiconductor layer 104 between adjacent gates comprise shared source/drain regions. That is, they contain one source/drain region for one FET abutting another source/drain region for another FET. For example, the portion of the semiconductor layer 104 between adjacent gates 115 and 125 contains source/drain region 111b of FET 110 and source/drain region 121a of FET 120 and the portion of the semiconductor layer 104 between adjacent gates 125 and 135 contains source/drain region 121b of FET 120 and source/drain region 131a of FET 130.

Each of the FETs 110, 120, 130 can further comprise additional features, including but not limited to, gate sidewall spacers 116, 126, 136, halo regions, source/drain extension regions and silicide layers. Inclusion of these additional features in planar FETs is well-known in the art and, thus, the details of such features are omitted from this specification in order to allow the reader to focus on the salient aspects of the embodiments described herein.

Integrated voltage equalization is achieved through a conformal conductive layer 150 having a desired resistance and positioned over the series-connected FETs 110, 120, 130 such that it is electrically isolated from the gates 115, 125, 135, but in contact with the source/drain regions 111a-b, 121a-b, 131a-b. Specifically, this conformal conductive layer 150 can comprise a conductive material that has a higher electrical resistance than the channel regions 112, 122, 132 of the series-connected FETs 110, 120, 130, when the FETs 110, 120, 130 are in the "on" state, but a lower electrical resistance than the channel regions 112, 122, 132 when the FETs 110, 120, 130 are in the "off" state. Those skilled in the art will recognize that the "on" state refers to a state when the gate voltage minus the source voltage is approximately one volt or more above the threshold voltage for the FETs 110, 120, 130 and that the "off" state refers to a state when the gate voltage is equal to the source voltage.

In one embodiment the conformal conductive layer 150 can comprise a polysilicon material doped with an n-type or p-type dopant in order to achieve the desired resistance. For example, if the FETs 110, 120, 130 comprise n-type FETs with source and drain regions 111a-b, 121a-b, 131a-b that are heavily doped with an n-type conductivity dopant (e.g., a Group V dopant, such as arsenic (As), phosphorous (P) or antimony (Sb)), then the conformal conductive layer 150 can comprise a polysilicon material that is doped with a lesser concentration of the same or a different n-type conductivity dopant. Conversely, if the FETs 110, 120, 130 comprise p-type FETs with source and drain regions 111a-b, 121a-b, 131a-b that are heavily doped with a p-type conductivity dopant (e.g., a Group III dopant, such as boron (B)), then the conformal conductive layer 150 can comprise a polysilicon material that is doped with a lesser concentration of the same or a different p-type conductivity dopant. In alternative embodiments, the conformal conductive layer 150 can comprise a metal material preselected for its resistance or a metal material infused with a species in order to achieve the desired resistance (e.g., as shown in U.S. Pat. No. 7,314,786 of Yang et al., issued on Jan. 1, 2008, assigned to International Business Machines Corporation, and incorporated herein by reference).

Electrical isolation of the conformal conductive layer 150 from the gates 115, 125, 135 can be achieved through various different means. For example, in the embodiment 100a shown in FIG. 1, electrical isolation of the conformal conductive layer 150 from the gates 115, 125, 135 is achieved through a combination of a dielectric cap layer 118, 128, 138 on the top surface 117, 127, 137 of each gate 115, 125, 135 and dielectric spacers 116, 126, 136 positioned laterally immediately adjacent to each gate 115, 125, 135 (i.e., on the gates sidewalls). In the embodiment 100b shown in FIG. 2, electrical isolation of the conformal conductive layer 150 from the gates 115, 125, 135 is achieved through a conformal dielectric layer 155 stacked between the gates 115, 125, 135 and the conformal conductive layer 150. In this case the conformal dielectric layer 155 has openings 156 located between any adjacent gates (e.g., between gates 115 and 125 and between gates 125 and 135) and also located at the ends 106 of the semiconductor layer 104. These openings 156 allow the conformal conductive layer 150 to contact the top surface 108 of the semiconductor layer 104 and, more particularly, the source/drain regions 111a and 131b at the ends 106 of the semiconductor layer 104 and the shared source/drain regions 111b-121a and 121b-131a between adjacent gates. As with the embodiment 100a shown in FIG. 1, the embodiment 100b shown in FIG. 2 can also comprise dielectric sidewall spacers 116, 126, 136 positioned laterally adjacent to the gate sidewalls either between the gate conductor 114, 124, 134 and the conformal dielectric layer 155 (as shown) or between the conformal dielectric layer 155 and the conformal conductive layer 150.

Finally, a first via 161 (i.e., a first contact) electrically connects both the conformal conductive layer 150 and a first source/drain region 111a of a first FET 110 in the series to a first supply voltage 117 (e.g., a positive supply voltage Vdd) and a second via 162 (i.e., a second contact) electrically connects both the conformal conductive layer 150 and a last source/drain region 131b of a last FET 130 in the series to a second supply voltage 118 different from the first supply voltage 117 (e.g., a negative supply voltage Vss).

FIGS. 3A and 4A show different embodiments 200a and 200b, respectively, of an integrated circuit device having two or more series-connected non-planar FETs (i.e., multiple stacked non-planar FETs) with integrated voltage equalization. For illustration purposes, the device is shown in FIGS. 3A and 4A as having three series-connected FETs 210, 220, and 230. FIG. 3A specifically shows an embodiment 200a having three series-connected dual-gate FETs with integrated voltage equalization, whereas FIG. 4A specifically shows an embodiment 200b having three series-connected tri-gate FETs with integrated voltage equalization.

The device can comprise a semiconductor fin 204. Specifically, the device can be formed on a semiconductor-on-insulator (SOI) wafer such that it comprises a semiconductor substrate 202 (e.g., a silicon (Si) substrate), an insulator layer 203 (e.g., a buried oxide (BOX) layer, a doped semiconductor layer or any other suitable insulator layer) above the semiconductor substrate 202 and a semiconductor fin 204 (e.g., a silicon (Si) fin, a silicon germanium (SiGe) fin or any other suitable semiconductor fin) above the insulator layer 203.

Multiple gates 215, 225, 235 can be positioned along the semiconductor fin 204, thereby defining, within the semiconductor fin 204, corresponding channel regions 212, 222, 232 for the multiple non-planar series-connected FETs 210, 220, 230. The gates 215, 225, 235 can be separated by a predetermined distance. Additionally, each gate 215, 225, 235 can have a horizontal portion traversing the top surface 208 of the fin 204 and vertical portions adjacent to the opposing sidewalls 209 of the fin 204 and extending from the horizontal portion down to the insulator layer 203 (see FIG. 3C and FIG. 4C). Furthermore, each gate 215, 225, 235 can comprise a conformal gate dielectric layer 213, 223, 233 on the top surface 208 and opposing sidewalls 209 of the fin 204 and a gate conductor layer 214, 224, 234 on the gate dielectric layer 213, 223, 233.

It should be noted that in the case of the series-connected dual-gate FETs of FIG. 3A, the semiconductor fin 204 can be relatively thin (e.g., can have a thickness that is approximately one-half (or less) the length of the gates 215, 225, 235 in order to ensure suppression of deleterious short-channel effects). Additionally, a dielectric cap layer 207 can be positioned on the top surface 208 of the fin 204 in order to isolate the top surface 208 from the gates 215, 225, 235 and, thereby, ensure that only two-dimensional field effects are exhibited. Whereas, in the case of the series-connected tri-gate FETs of FIG. 4A, the semiconductor fin 204 can be relatively wide (e.g., can have a fin height to width ratio of between 3:2 and 2:3) and can be devoid of a dielectric cap layer such that three-dimensional field effects are exhibited.

Source/drain regions 211a-b, 221a-b, 231a-b can be located within the semiconductor fin 204 on opposing sides of each of the channel regions 212, 222, 232 such that the portions of the semiconductor fin 204 between adjacent gates comprise shared source/drain regions. That is, they contain one source/drain region for one FET abutting another source/drain region for another FET. For example, the portion of the semiconductor fin 204 between adjacent gates 215 and 225 contains source/drain region 211b of FET 210 and source/drain region 221a of FET 220 and the portion of the semiconductor fin 204 between adjacent gates 225 and 235 contains source/drain region 221b of FET 220 and source/drain region 231a of FET 230.

Each of the FETs 210, 220, 230 can further comprise additional features, including but not limited to, gate sidewall spacers 216, 226, 236, halo regions, source/drain extension regions and silicide layers. Inclusion of these features in non-planar FETs is well-known in the art and, thus, the details of such features are omitted from this specification in order to allow the reader to focus on the salient aspects of the embodiments described herein.

Integrated voltage equalization is achieved through a conformal conductive layer 250 having a desired resistance and positioned over the series-connected FETs 210, 220, 230 such that it is electrically isolated from the gates 215, 225, 235, but in contact with the source/drain regions 211a-b, 221a-b, 231a-b. Specifically, this conformal conductive layer 250 can comprise a conductive material that has a higher electrical resistance than the channel regions 212, 222, 232 of the series-connected FETs 210, 220, 230, when the FETs 210, 220, 230 are in the "on" state, but a lower electrical resistance than the channel regions 212, 222, 232 when the FETs 210, 220, 230 are in the "off" state. Those skilled in the art will recognize that the "on" state refers to a state when the gate voltage minus the source voltage is approximately one volt or more above the threshold voltage for the FETs 210, 220, 230 and that the "off" state refers to a state when the gate voltage is equal to the source voltage.

In one embodiment the conformal conductive layer 250 can comprise a polysilicon material doped with an n-type or p-type dopant in order to achieve the desired resistance. For example, if the FETs 210, 220, 230 comprise n-type FETs with source and drain regions 211a-b, 221a-b, 231a-b that are heavily doped with an n-type conductivity dopant (e.g., a Group V dopant, such as arsenic (As), phosphorous (P) or antimony (Sb)), then the conformal conductive layer 150 can comprise a polysilicon material that is doped with a lesser concentration of the same or a different n-type conductivity dopant. Conversely, if the FETs 210, 220, 230 comprise p-type FETs with source and drain regions 211a-b, 221a-b, 231a-b that are heavily doped with a p-type conductivity dopant (e.g., a Group III dopant, such as boron (B)), then the conformal conductive layer 250 can comprise a polysilicon material that is doped with a lesser concentration of the same or a different p-type conductivity dopant. In alternative embodiments, the conformal conductive layer 250 can comprise a metal material preselected for its resistance or a metal material infused with a species in order to achieve the desired resistance (e.g., as shown in U.S. Pat. No. 7,314,786 of Yang et al., issued on Jan. 1, 2008, assigned to International Business Machines Corporation, and incorporated herein by reference).

Electrical isolation of the conformal conductive layer 250 from the gates 215, 225, 235 can be achieved, for example, through a conformal dielectric layer 255 stacked between the gates 215, 225, 235 and the conformal conductive layer 250. This conformal dielectric layer 255 can further have openings 256 located between any adjacent gates (e.g., between gates 215 and 225 and between gates 225 and 235) and also located at the opposing ends 206 of the semiconductor fin 204. These openings 256 can allow the conformal conductive layer 250 to contact the top surface 208 and opposing sides of the semiconductor fin 204 and, more particularly, the source/drain regions 211a and 231b at the ends 206 of the fin 204 and the shared source/drain regions 211b-121a and 221b-231a between adjacent gates. Specifically, the openings 256 in the conformal dielectric layer 255 at the ends 206 of the fin 204 and between adjacent gates will be patterned such that, when deposited, the conformal conductive layer 250 will traverse the top surface 208 of the fin 204 and further extend vertically along the opposing sidewalls 209 of the fin 204. In the case of the series-connected dual-gate FETs, the conformal conductive layer 250 will only contact the opposing sidewalls 209 of the semiconductor fin 204 through the openings 256, due to the dielectric cap layer 207 on the top surface 208 of the fin 204 (see FIG. 3B). However, in the case of the series-connected tri-gate FETs, the conformal conductive layer 250 will contact the opposing sidewalls 209 and the top surface 208 of the semiconductor fin 204 through the openings 256 (see FIG. 4B).

Finally, a first via 261 (i.e., a first contact) electrically connects both the conformal conductive layer 250 and a first source/drain region 211a of a first FET 210 in the series to a first supply voltage 217 (e.g., a positive supply voltage Vdd) and a second via 262 (i.e., a second contact) electrically connects both the conformal conductive layer 250 and a last source/drain region 23 lb of a last FET 230 in the series to a second supply voltage 218 different from the first supply voltage 117 (e.g., a negative supply voltage Vss).

Figure 5:
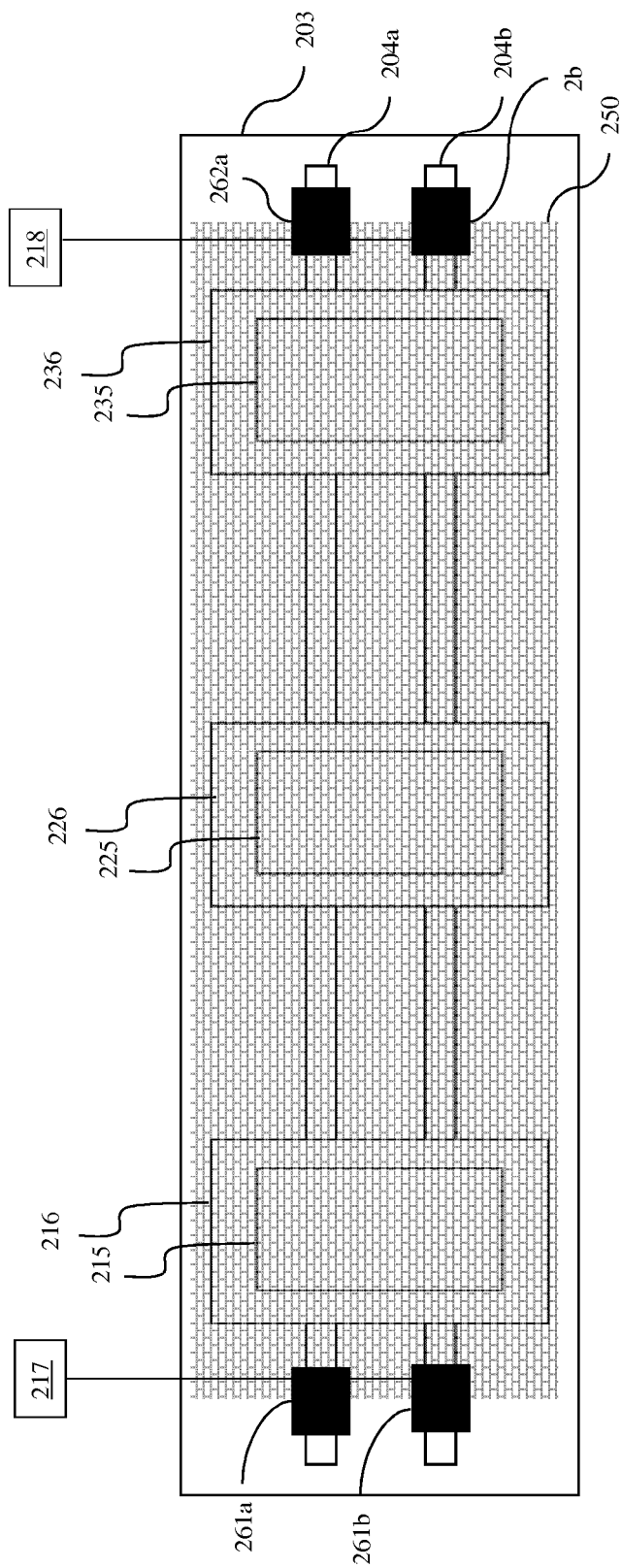
FIG. 5 is a schematic drawing illustrating an embodiment of an integrated circuit device having series-connected multi-fin FETs with integrated voltage equalization.

It should be noted that, while the embodiments 200a and 200b are illustrated in FIGS. 3A-C and 4A-C as having a single semiconductor fin 204, it is anticipated that these embodiments could, alternatively, comprise multiple semiconductor fins 204a-b over which the gates 215, 225, 235 with gate sidewall spacers 216, 226, 236 are formed in order to increase the effective channel width and, thereby the device drive current of each FET 210, 220, 230 in the series (see FIG. 5). In this case, the conformal conductive layer 250 would extend across the gates and each of the fins 204a-b. Additionally, first vias 261a-b dropping to the fins 204a-b at one end would be electrically connected to a first supply voltage 217 (e.g., Vdd) and second vias 262a-b dropping to the fins 204a-b at the opposite end would be electrically connected to a second supply voltage 218 (e.g., Vss). Electrical isolation between the gates 215, 225, 235 and the conformal conductive layer 250 would be achieved, as described above, through a conformal dielectric layer that has patterned openings that allow the conformal conductive layer to contact the source/drain regions of each fin 204a-b at the ends of each fin and between adjacent gates.

Also disclosed are embodiments of a method of forming an integrated circuit device having two or more series-connected FETs with integrated voltage equalization, such as the devices 100a of FIG. 1, 100b of FIG. 2, 200a of FIG. 3A and 200b of FIG. 4A.

Figure 6:
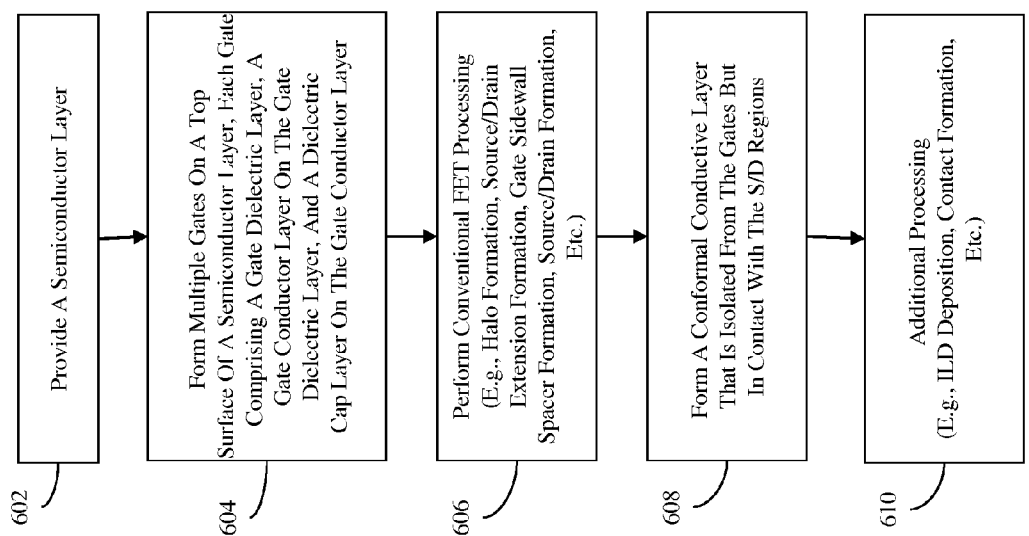
FIG. 6 is a flow diagram illustrating an embodiment of a method of forming the device of FIG. 1.
Figure 7:
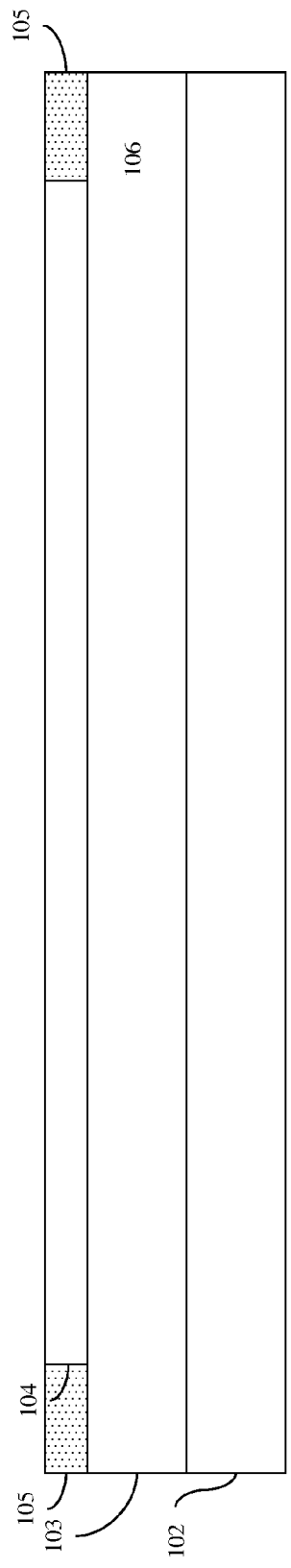
FIG. 7 is a schematic drawing illustrating a partially completed structure formed according to the method of FIG. 6.

Referring to the flow diagram of FIG. 6, in one method embodiment the device 100a of FIG. 1 can be formed by first providing a semiconductor layer 104 (602, see FIG. 7). For example, a semiconductor-on-insulator (SOI) wafer can be provided that comprises a semiconductor substrate 102 (e.g., a silicon (Si) substrate), an insulator layer 103 (e.g., a buried oxide (BOX) layer, a doped semiconductor layer or any other suitable insulator layer) above the semiconductor substrate 102 and a semiconductor layer 104 (e.g., a silicon (Si) layer, a silicon germanium (SiGe) layer or any other suitable semiconductor layer) above the insulator layer 103. Alternatively, a bulk semiconductor wafer (e.g., a bulk silicon wafer) can be provided.

Isolation regions 105 (e.g., shallow trench isolation (STI) regions) can be formed in the semiconductor layer 104 above the isolation layer 103 in order to define the active region for the multiple planar series-connected FETs 110, 120, 130. Such isolation regions 105 can be formed using, for example, conventional STI formation techniques.

Figure 8:
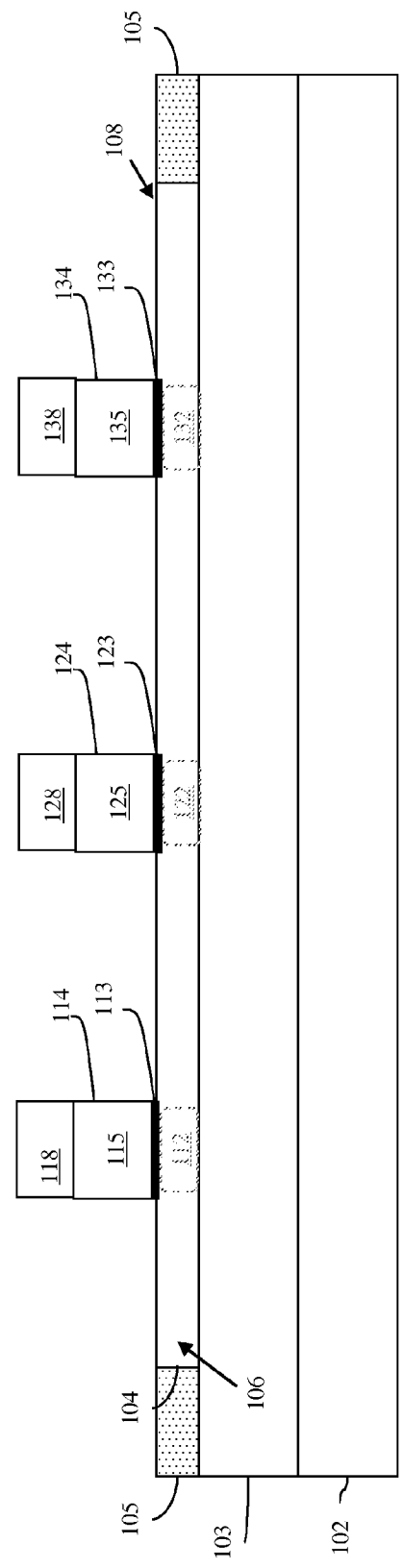
FIG. 8 is a schematic drawing illustrating a partially completed structure formed according to the method of FIG. 6.

Next, multiple gates 115, 125, 135 can be formed on the top surface 108 of the semiconductor layer 104, thereby defining, within the semiconductor layer 104, corresponding channel regions 112, 122, 132 for multiple series-connected planar FETs (604, see FIG. 8). Specifically, a thin gate dielectric layer (e.g., a gate oxide layer, a high-k gate dielectric layer or any other suitable gate dielectric layer) can be formed on the top surface of the semiconductor layer, a gate conductor layer (e.g., a doped polysilicon layer, a metal layer or any other suitable gate conductor layer) can be formed on the gate dielectric layer, and a dielectric cap layer (e.g., an oxide cap layer, a nitride cap layer, an oxynitride cap layer, etc.) can be formed the gate conductor layer. The resulting structure can then be lithographically patterned using conventional techniques to form multiple gates 115, 125, 135 on the top surface 108 of semiconductor layer 104 with each gate separated by a predetermined distance. As a result, each gate 115, 125, 135 formed at process 604 can comprise a gate dielectric layer 113, 123, 133 on the semiconductor layer 104, a gate conductor layer 114, 124, 134 on the gate dielectric layer 113, 123, 133, and a dielectric cap layer 118, 128, 138 on the gate conductor layer 114, 124, 134 (606).

Figure 9:
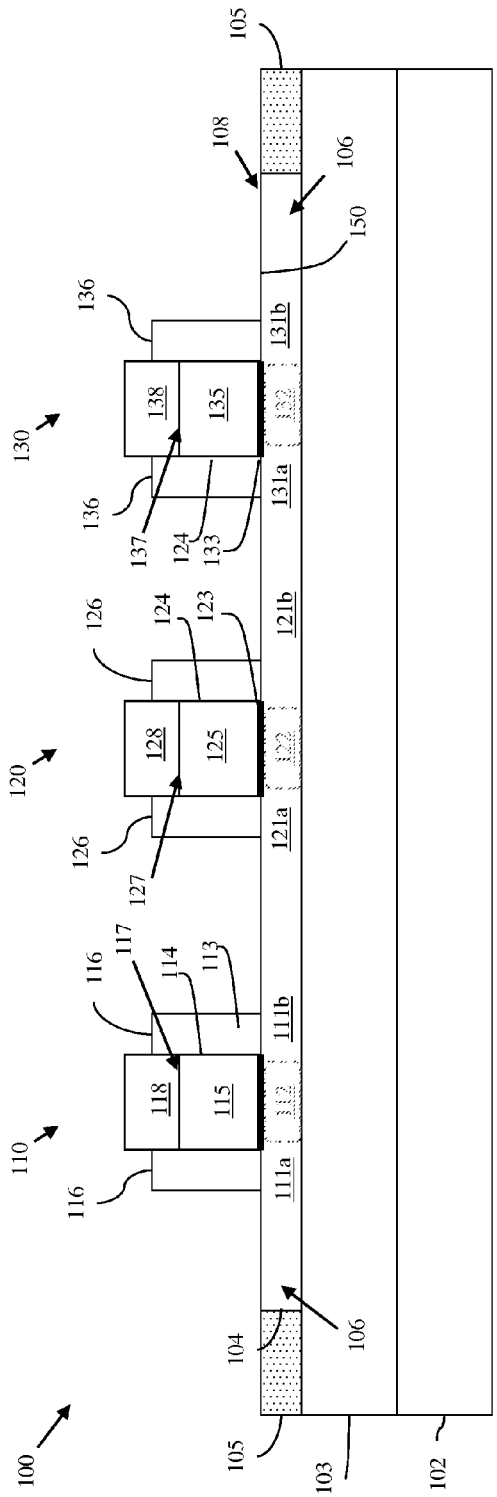
FIG. 9 is a schematic drawing illustrating a partially completed structure formed according to the method of FIG. 6.

After the gates 115, 125, 135 are formed at process 604, conventional planar FET processing can be performed (606, see FIG. 9)). This conventional planar FET processing can include the formation of source and drain regions 111a-b, 121a-b, 131a-b within the semiconductor layer 104 on opposing sides of each of the channel regions 112, 122, 132 such that the portions of the semiconductor layer 104 between adjacent gates will comprise shared source and drain regions. That is, they will contain one source/drain region for one FET abutting another source/drain region for another FET. For example, the portion of the semiconductor layer 104 between adjacent gates 115 and 125 will contain source/drain region 111b of FET 110 and source/drain region 121a of FET 120 and the portion of the semiconductor layer 104 between adjacent gates 125 and 135 will contain source/drain region 121b of FET 120 and source/drain region 131a of FET 130. Conventional planar FET processing can further include, but is not limited to, the formation of gate sidewall spacers 116, 126, 136, the formation of halo regions, the formation of source/drain extension regions and/or the formation of silicide layers. Techniques for forming such FET components are well-known in the art and, thus, the details are omitted from this specification in order to allow the reader to focus on the salient aspects of the embodiments described.

Figure 10:
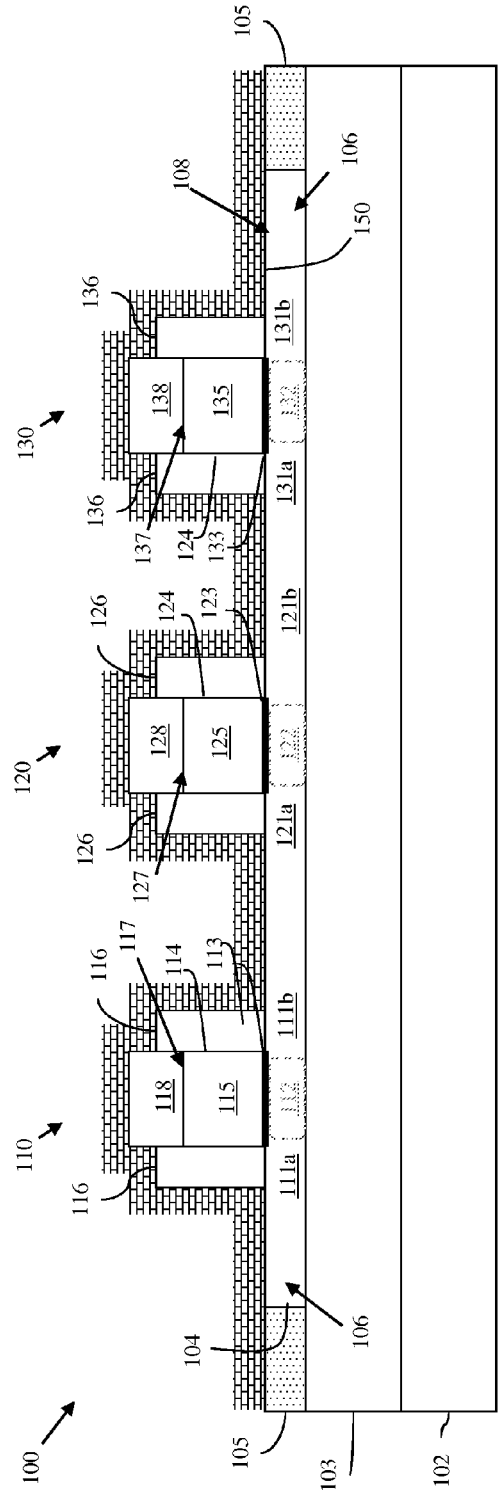
FIG. 10 is a schematic drawing illustrating a partially completed structure formed according to the method of FIG. 6.

Subsequently, a conformal conductive layer 150 having a desired resistance can be formed over the planar FETs 110, 120, 130 such that it is electrically isolated from the gates 115, 125, 135, but in contact with the source and drain regions 111a-b, 121a-b, 131a-b (608, see FIG. 10). Specifically, the conformal conductive layer 150 can be formed at process 608 such that it comprises a conductive material that will have a higher electrical resistance than the channel regions 112, 122, 132 of the series-connected FETs 110, 120, 130, when the FETs 110, 120, 130 are in the "on" state, but a lower electrical resistance than the channel regions 112, 122, 132 when the FETs 110, 120, 130 are in the "off" state. Those skilled in the art will recognize that the "on" state refers to a state when the gate voltage minus the source voltage is approximately one volt or more above the threshold voltage for the FETs 110, 120, 130 and that the "off" state refers to a state when the gate voltage is equal to the source voltage.

For example, in one embodiment a polysilicon material can be deposited and either in-situ doped or subsequently implanted with a sufficient concentration of an n-type or p-type dopant in order to achieve the desired resistance. For example, if the FETs 110, 120, 130 comprise n-type FETs with source and drain regions 111a-b, 121a-b, 131a-b that are heavily doped with an n-type conductivity dopant (e.g., a Group V dopant, such as arsenic (As), phosphorous (P) or antimony (Sb)), then a conformal layer of polysilicon can be deposited and either in-situ doped or subsequently implanted with a lesser concentration of the same or a different n-type conductivity dopant. Conversely, if the FETs 110, 120, 130 comprise p-type FETs with source and drain regions 111a-b, 121a-b, 131a-b that are heavily doped with a p-type conductivity dopant (e.g., a Group III dopant, such as boron (B)), then a conformal layer of polysilicon can be deposited and either in-situ doped or subsequently implanted with a lesser concentration of the same or a different p-type conductivity dopant. In alternative embodiments, a conformal metal layer can be deposited over the FETs 110, 120, 130. This metal layer can be either preselected for its resistance or subsequently infused with a species in order to achieve the desired resistance (e.g., as shown in U.S. Pat. No. 7,314,786 of Yang et al., issued on Jan. 1, 2008, assigned to International Business Machines Corporation, and incorporated herein by reference).

In this method embodiment, electrical isolation of the conformal conductive layer 150 from the gates 115, 125, 135 is achieved through a combination of the dielectric cap layer 118, 128, 138 on the top surface 117, 127, 137 of each gate 115, 125, 135 and the dielectric spacers 116, 126, 136 positioned laterally immediately adjacent to each gate 115, 125, 135 (i.e., on the gates sidewalls).

After the conformal conductive layer 150 is formed at process 608, additional processing necessary to complete the device 100a can be performed (610, see FIG. 1). Such processing can include, but is not limited to, the following: depositing and planarizing an inter-layer dielectric (ILD) 180; forming vias (i.e., contacts) to each end of the semiconductor layer 104 (e.g., forming a first via 161 that contacts the conformal conductive layer 150 and a first source/drain region 111a of a first FET 110 in the series and forming a second via 162 that contacts the conformal conductive layer 150 and a last source/drain region 131b of a last FET 130 in the series); and electrically connecting the first via 161 to a first supply voltage 117 (e.g., a positive supply voltage Vdd) and the second via 162 to a second supply voltage 118 different from said first supply voltage (e.g., a negative supply voltage Vss).

Figure 11:
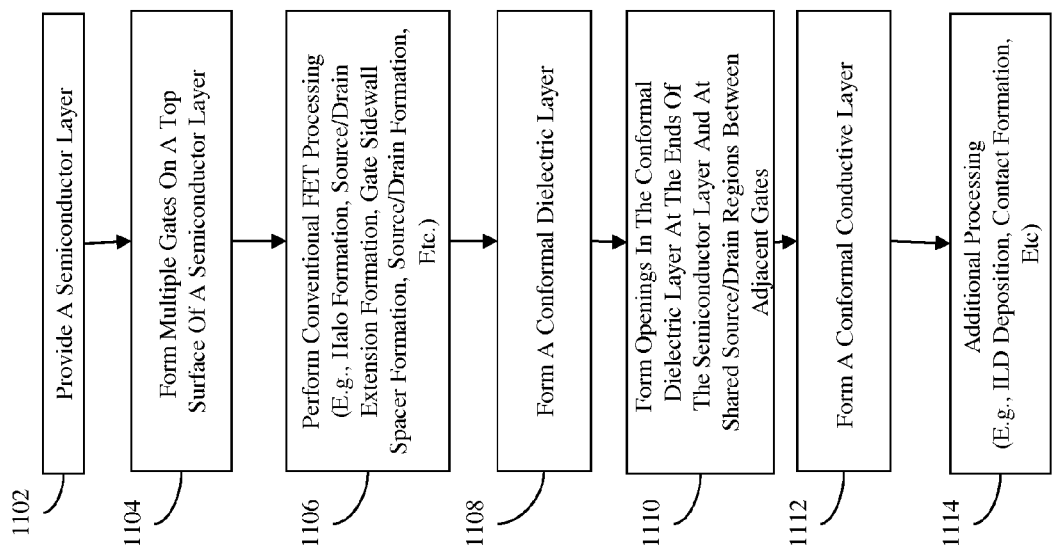
FIG. 11 is a flow diagram illustrating an embodiment of a method of forming the device of FIG. 2.

Referring to the flow diagram of FIG. 11, in another method embodiment the device 100b of FIG. 2 can be formed by first providing a semiconductor layer 104 (1102, see FIG. 7). For example, a semiconductor-on-insulator (SOI) wafer can be provided that comprises a semiconductor substrate 102 (e.g., a silicon (Si) substrate), an insulator layer 103 (e.g., a buried oxide (BOX) layer, a doped semiconductor layer or any other suitable insulator layer) above the semiconductor substrate 102 and a semiconductor layer 104 (e.g., a silicon (Si) layer, a silicon germanium (SiGe) layer or any other suitable semiconductor layer) above the insulator layer 103. Alternatively, a bulk semiconductor wafer (e.g., a bulk silicon wafer) can be provided.

Isolation regions 105 (e.g., shallow trench isolation (STI) regions) can be formed in the semiconductor layer 104 above the isolation layer 103 in order to define the active region for the multiple planar series-connected FETs 110, 120, 130. Such isolation regions 105 can be formed using, for example, conventional STI formation techniques.

Figure 12:
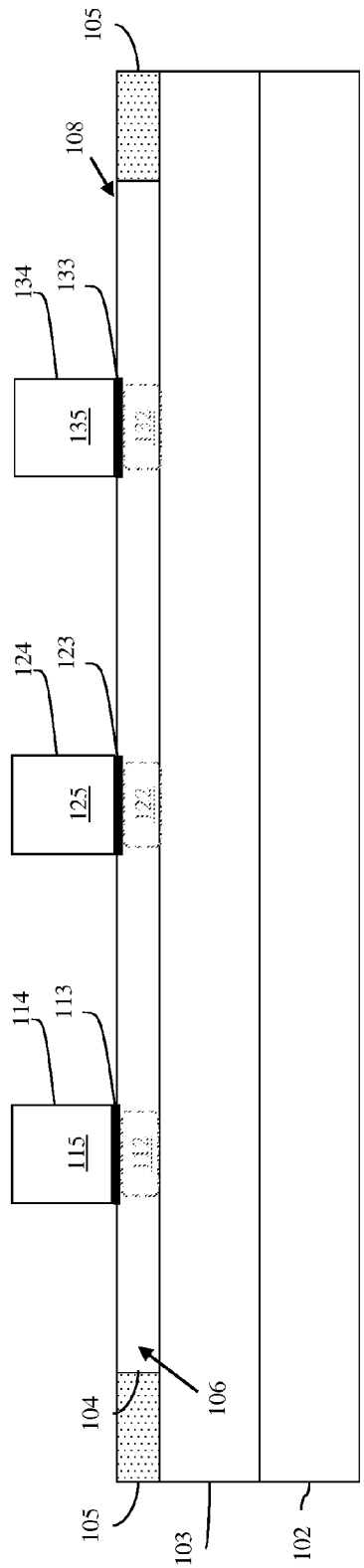
FIG. 12 is a schematic drawing illustrating a partially completed structure formed according to the method of FIG. 11.

Next, multiple gates 115, 125, 135 can be formed on the top surface 108 of the semiconductor layer 104, thereby defining, within the semiconductor layer 104, corresponding channel regions 112, 122, 132 for multiple series-connected planar FETs (1104, see FIG. 12). Specifically, a thin gate dielectric layer (e.g., a gate oxide layer, a high-k gate dielectric layer or any other suitable gate dielectric layer) can be formed on the top surface of the semiconductor layer and a gate conductor layer (e.g., a doped polysilicon layer, a metal layer or any other suitable gate conductor layer) can be formed on the gate dielectric layer. The resulting structure can then be lithographically patterned using conventional techniques to form the multiple gates 115, 125, 135 on the top surface 108 of semiconductor layer 104, with each gate separated by a predetermined distance. As a result, each gate 115, 125, 135 formed at process 1104 will comprise a gate dielectric layer 113, 123, 133 on the semiconductor layer 104 and a gate conductor layer 114, 124, 134 on the gate dielectric layer 113, 123, 133 (1106). In this method embodiment, the gates are formed without a dielectric cap layer.

Figure 13:
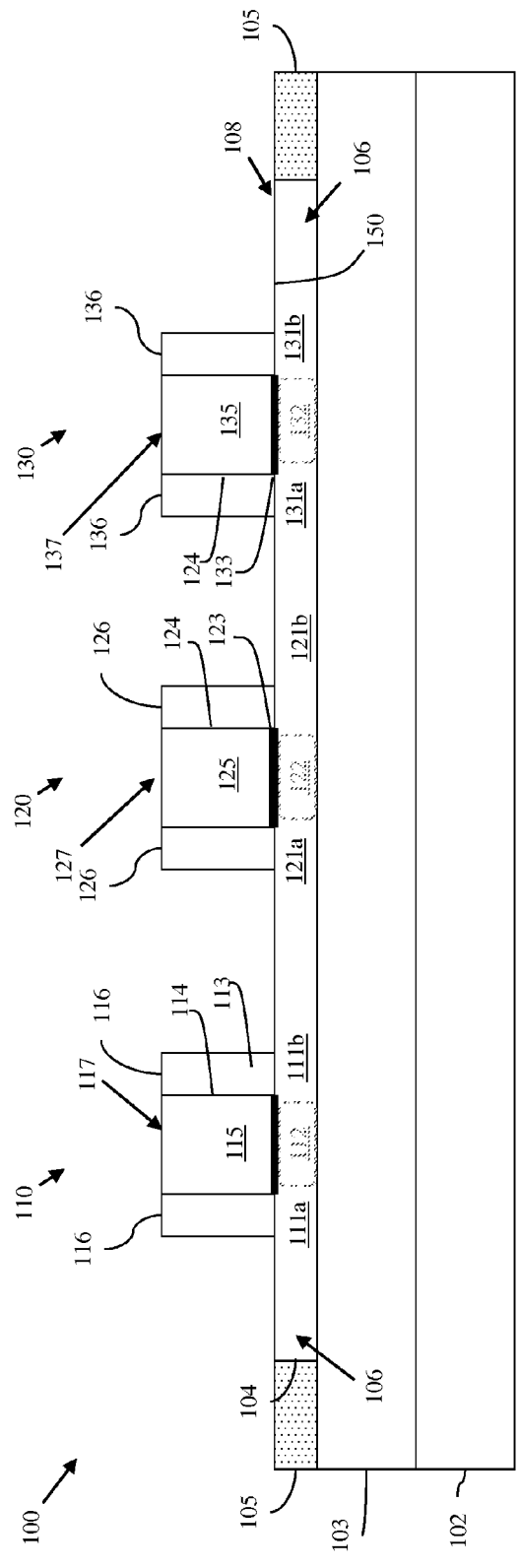
FIG. 13 is a schematic drawing illustrating a partially completed structure formed according to the method of FIG. 11.

After the gates 115, 125, 135 are formed at process 1104, conventional planar FET processing can be performed (1106, see FIG. 13)). This conventional planar FET processing can include the formation of source and drain regions 111a-b, 121a-b, 131a-b within the semiconductor layer 104 on opposing sides of each of the channel regions 112, 122, 132 such that the portions of the semiconductor layer 104 between adjacent gates will comprise shared source and drain regions. That is, they will contain one source/drain region for one FET abutting another source/drain region for another FET. For example, the portion of the semiconductor layer 104 between adjacent gates 115 and 125 will contain source/drain region 111b of FET 110 and source/drain region 121a of FET 120 and the portion of the semiconductor layer 104 between adjacent gates 125 and 135 will contain source/drain region 121b of FET 120 and source/drain region 131a of FET 130. Conventional planar FET processing can further include, but is not limited to, the formation of gate sidewall spacers 116, 126, 136, the formation of halo regions, the formation of source/drain extension regions and/or the formation of silicide layers. Techniques for forming such FET components are well-known in the art and, thus, the details are omitted from this specification in order to allow the reader to focus on the salient aspects of the embodiments described.

Figure 14:
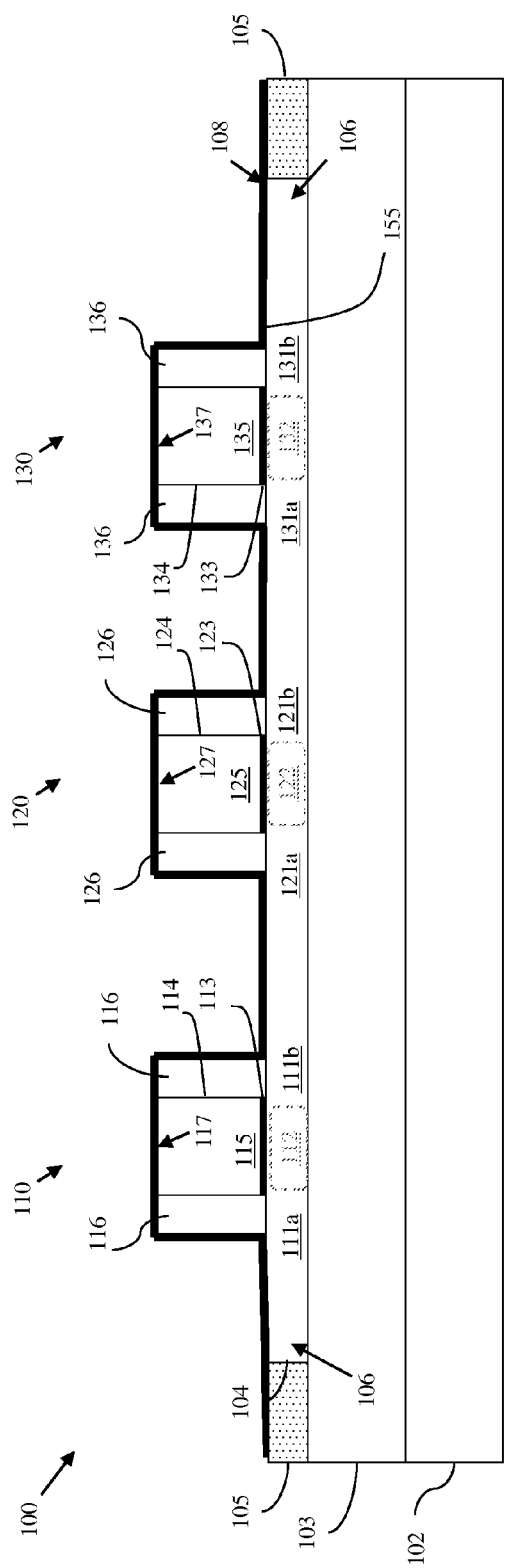
FIG. 14 is a schematic drawing illustrating a partially completed structure formed according to the method of FIG. 11.
Figure 15:
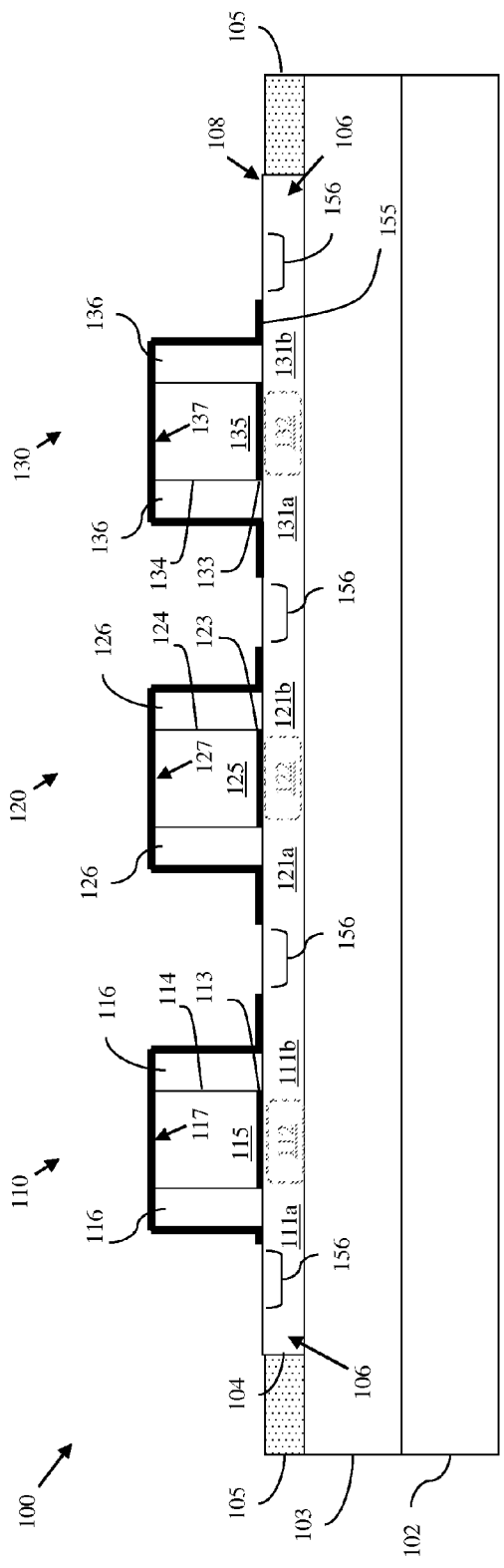
FIG. 15 is a schematic drawing illustrating a partially completed structure formed according to the method of FIG. 11.

Next, a conformal dielectric layer 155 can be deposited over the planar FETs 110, 120, 130 and, more particularly, over the gates 115, 125, 135 and across any exposed portions of the semiconductor layer 104 (1108, see FIG. 14). This conformal dielectric layer 155 can comprise an oxide material (e.g., SiO2), a nitride material (e.g., Si3N4), an oxynitride material (e.g., SiOxNy) or any other suitable dielectric material. Then, using conventional lithographic patterning techniques, openings 156 can be formed through the conformal dielectric layer 155 at each end 106 of the semiconductor layer 104 and between any adjacent gates (e.g., between gates 115 and 125 and between gates 125 and 135) (1110, see FIG. 15). These openings 156 can expose the top surface 108 of the semiconductor layer 104 above the first and last source/drain regions 111a and 131b and above any shared source/drain regions (e.g., 111b/121a and 121b/131a).

Figure 16:
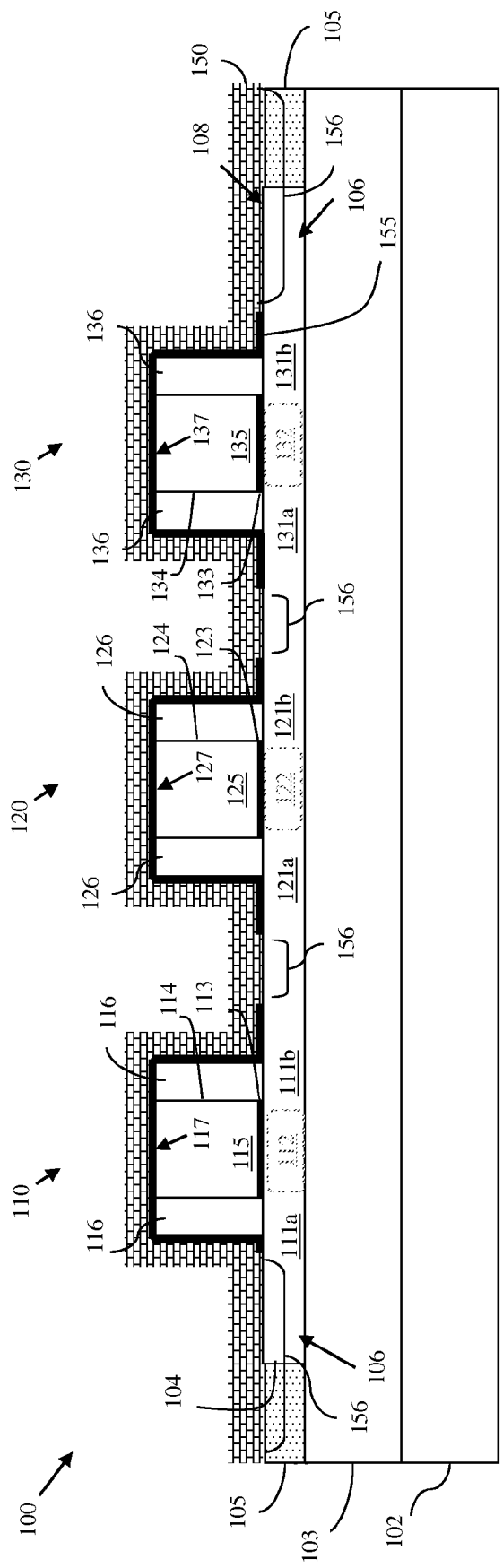
FIG. 16 is a schematic drawing illustrating a partially completed structure formed according to the method of FIG. 11.

Then, a conformal conductive layer 150 having a desired resistance can be formed over the planar FETs 110, 120, 130 such that it is electrically isolated from the gates 115, 125, 135 by the conformal dielectric layer 155 and any gate sidewall spacers 116, 126, 136 and further such that it contacts the exposed top surface 108 of the semiconductor layer 104 and, thereby the first and last source/drain regions 111a and 131b and any shared source/drain regions (e.g., 111b/121a and 121b/131a), through the openings 156 (1112, see FIG. 16). This conformal conductive layer 155 should be formed at process 1112 such that it comprises a conductive material that will have a higher electrical resistance than the channel regions 112, 122, 132 of the series-connected FETs 110, 120, 130, when the FETs 110, 120, 130 are in the "on" state, but a lower electrical resistance than the channel regions 112, 122, 132 when the FETs 110, 120, 130 are in the "off" state. Those skilled in the art will recognize that the "on" state refers to a state when the gate voltage minus the source voltage is approximately one volt or more above the threshold voltage for the FETs 110, 120, 130 and that the "off" state refers to a state when the gate voltage is equal to the source voltage.

For example, in one method embodiment a polysilicon material can be deposited and either in-situ doped or subsequently implanted with a sufficient concentration of an n-type or p-type dopant in order to achieve the desired resistance. For example, if the FETs 110, 120, 130 comprise n-type FETs with source and drain regions 111a-b, 121a-b, 131a-b that are heavily doped with an n-type conductivity dopant (e.g., a Group V dopant, such as arsenic (As), phosphorous (P) or antimony (Sb)), then a conformal layer of polysilicon can be deposited and either in-situ doped or subsequently implanted with a lesser concentration of the same or a different n-type conductivity dopant. Conversely, if the FETs 110, 120, 130 comprise p-type FETs with source and drain regions 111a-b, 121a-b, 131a-b that are heavily doped with a p-type conductivity dopant (e.g., a Group III dopant, such as boron (B)), then a conformal layer of polysilicon can be deposited and either in-situ doped or subsequently implanted with a lesser concentration of the same or a different p-type conductivity dopant. In alternative method embodiments, a conformal metal layer can be deposited. This metal layer can be either preselected for its resistance or subsequently infused with a species in order to achieve the desired resistance (e.g., as shown in U.S. Pat. No. 7,314,786 of Yang et al., issued on Jan. 1, 2008, assigned to International Business Machines Corporation, and incorporated herein by reference).

After the conformal conductive layer 150 is formed at process 1112, additional processing necessary to complete the device 100b can be performed (1114, see FIG. 2). Such processing can include, but is not limited to, the following: depositing and planarizing an inter-layer dielectric (ILD) 180; forming vias (i.e., contacts) to each end of the semiconductor layer 104 (e.g., forming a first via 161 that contacts the conformal conductive layer 150 and a first source/drain region 111a of a first FET 110 in the series and forming a second via 162 that contacts the conformal conductive layer 150 and a last source/drain region 131b of a last FET 130 in the series); and electrically connecting the first via 161 to a first supply voltage 117 (e.g., Vdd) and the second via 162 to a second supply voltage 118 different from said first supply voltage (e.g., Vss).

Figure 17:
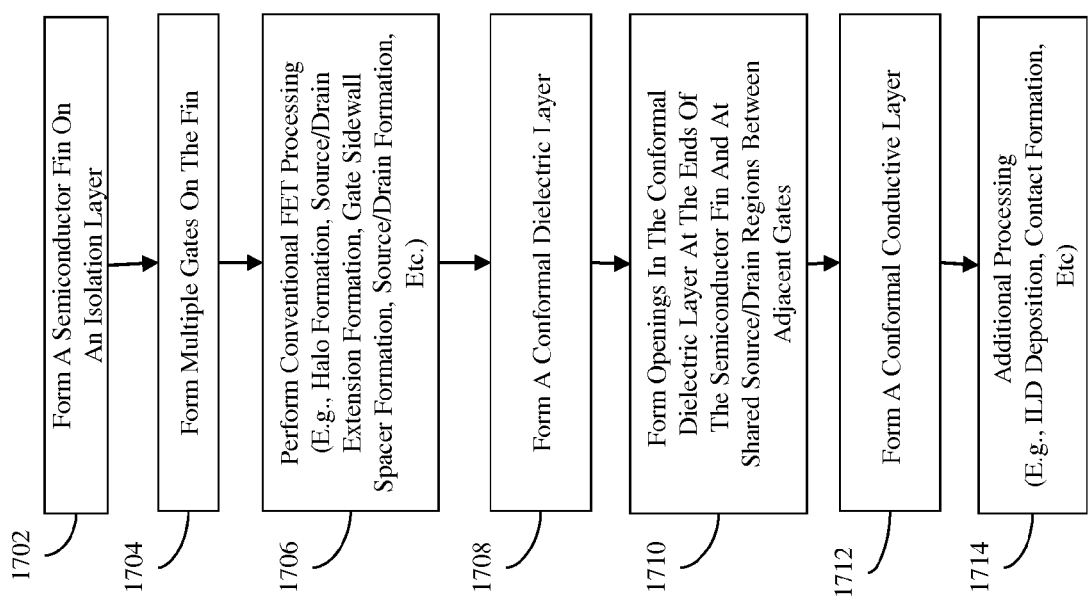
FIG. 17 is a flow diagram illustrating embodiments of a method of forming a device having series-connected non-planar FETs with integrated voltage equalization such as the device of FIG. 3A or the device of FIG. 4A.
Figure 19:
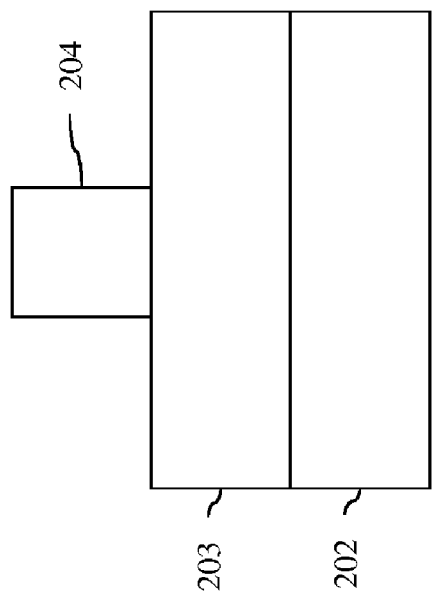
FIG. 19 is a schematic drawing illustrating a semiconductor fin configured for series-connected tri-gate FETs and formed according to the method of FIG. 17.
Figure 18:
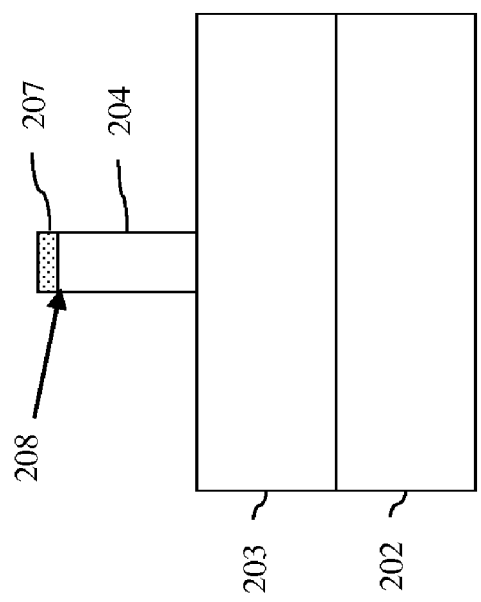
FIG. 18 is a schematic drawing illustrating a semiconductor fin configured for series-connected dual-gate FETs and formed according to the method of FIG. 17.

Referring to the flow diagram of FIG. 17, in additional method embodiments, the device 200a of FIG. 3A or 200b of FIG. 4A can be formed by first forming a semiconductor fin 204 on an isolation layer 203 (1702, see FIGS. 18 and 19). For example, a semiconductor-on-insulator (SOI) wafer can be provided that comprises a semiconductor substrate 202 (e.g., a silicon (Si) substrate), an insulator layer 203 (e.g., a buried oxide (BOX) layer, a doped semiconductor layer or any other suitable insulator layer) above the semiconductor substrate 202 and a semiconductor layer (e.g., a silicon (Si) layer, a silicon germanium (SiGe) layer or any other suitable semiconductor layer) above the insulator layer 203. Conventional lithographic patterning techniques can be used to form a semiconductor fin 204 (i.e., a rectangular shaped semiconductor body) from the semiconductor layer.

It should be noted that in the case of the series-connected dual-gate FETs of FIG. 3A, the semiconductor fin 204 can be formed at process 1702 such that it is relatively thin (e.g., such that it has a thickness that will be approximately one-half (or less) the length of any subsequently formed gates 215, 225, 235 to ensure suppression of deleterious short-channel effects) and further such that the top surface 208 is covered by a dielectric cap layer 207, thereby ensuring that only two-dimensional field effects will be exhibited (see FIG. 18). Whereas, in the case of series-connected tri-gate FETs of FIG. 4A, the semiconductor fin 204 can be formed at process 1702 such that it is relatively wide (e.g., such that it has a fin height to width ratio between 3:2 and 2:3) and further such that it is devoid of a dielectric cap layer, thereby ensuring that three-dimensional field effects will be exhibited (see FIG. 19). It should further be noted that, after semiconductor fin formation at process 1702, the remaining process steps necessary to form the device 200a of FIG. 3A and the device 200b of FIG. 4A are essentially the same. For illustration purposes, these process steps will be shown in FIGS. 20A-b through 24 with respect to the device 200a.

Next, multiple gates 215, 225, 235 can be formed along the semiconductor fin 204, thereby defining, within the semiconductor fin 204, corresponding channel regions 212, 122, 232 for multiple series-connected planar FETs (1704, see FIG. 20A). Specifically, a thin conformal gate dielectric layer (e.g., a gate oxide layer, a high-k gate dielectric layer or any other suitable gate dielectric layer) can be formed such that it covers the top surface and opposing sidewalls of the semiconductor fin 204. Then, a blanket gate conductor layer (e.g., a doped polysilicon layer, a metal layer or any other suitable gate conductor layer) can be formed on the gate dielectric layer. Then, conventional lithographic patterning techniques can be used to form the multiple gates 215, 225, 235 with each gate separated by a predetermined distance. As a result, each gate 215, 225, 235 will have a horizontal portion traversing the top surface 208 of the fin 204 and vertical portions adjacent to the opposing sidewalls 209 of the fin 204 and extending from the horizontal portion down to the insulator layer 202 (see FIG. 3C and FIG. 4C). Also, as a result, each gate 215, 225, 235 will comprise a conformal gate dielectric layer 213, 223, 233 on the top surface 208 and opposing sidewalls 209 of the fin 204 and a gate conductor layer 214, 224, 234 on the gate dielectric layer 213, 223, 233 (see FIG. 20B).

Figure 21:
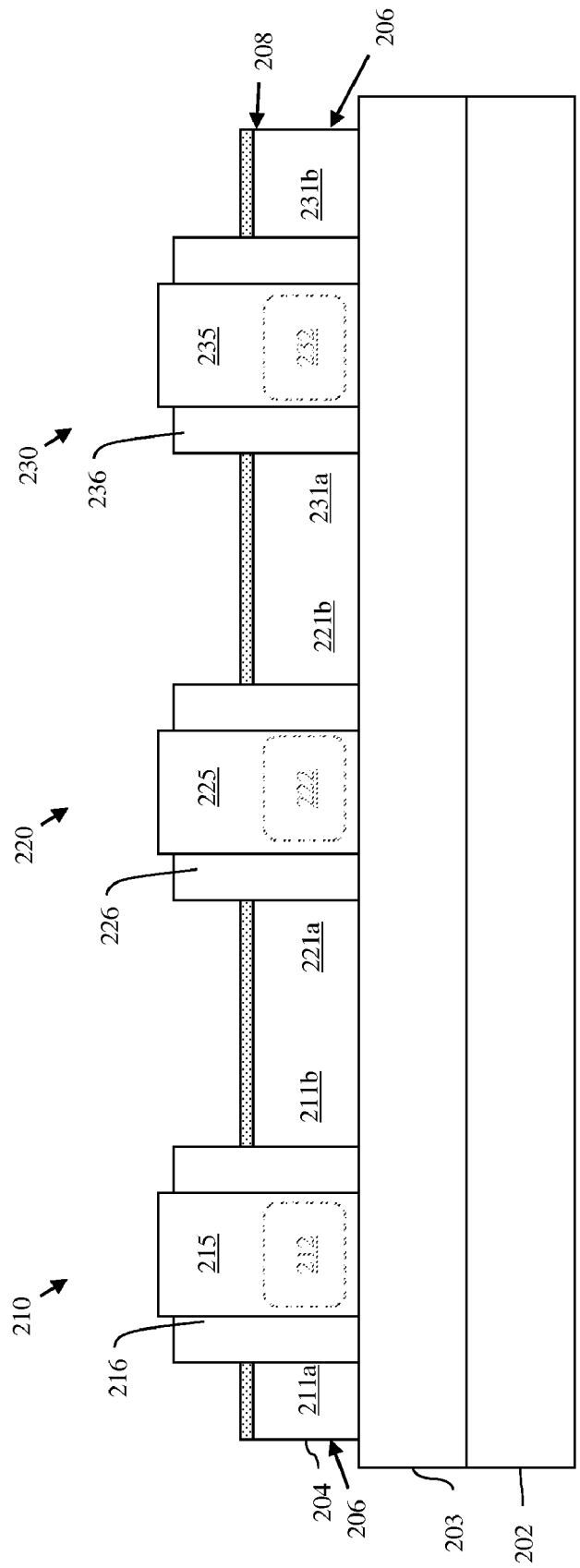
FIG. 21 is a schematic drawing illustrating a partially completed structure formed according to the method of FIG. 17.

After the gates 215, 225, 235 are formed at process 1704, conventional non-planar FET processing can be performed (1706, see FIG. 21)). This conventional non-planar FET processing can include the formation of source and drain regions 211a-b, 221a-b, 231a-b within the semiconductor fin 204 on opposing sides of each of the channel regions 212, 222, 232 such that the portions of the semiconductor fin 204 between adjacent gates will comprise shared source and drain regions. That is, they will contain one source/drain region for one FET abutting another source/drain region for another FET. For example, the portion of the semiconductor fin 204 between adjacent gates 215 and 225 will contain source/drain region 211b of FET 210 and source/drain region 221a of FET 220 and the portion of the semiconductor fin 204 between adjacent gates 225 and 235 will contain source/drain region 221b of FET 220 and source/drain region 231a of FET 230. Conventional non-planar FET processing can further include, but is not limited to, the formation of gate sidewall spacers 216, 226, 236, the formation of halo regions, the formation of source/drain extension regions and/or the formation of silicide layers. Techniques for forming such FET components are well-known in the art and, thus, the details are omitted from this specification in order to allow the reader to focus on the salient aspects of the embodiments described.

Figure 22:
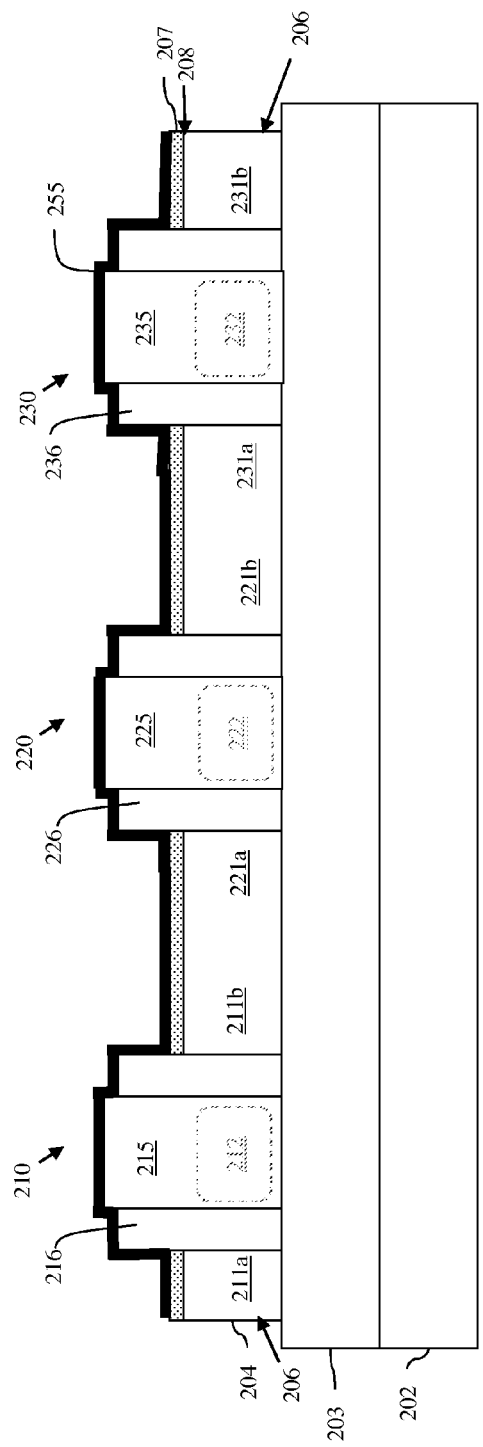
FIG. 22 is a schematic drawing illustrating a partially completed structure formed according to the method of FIG. 17.
Figure 23:
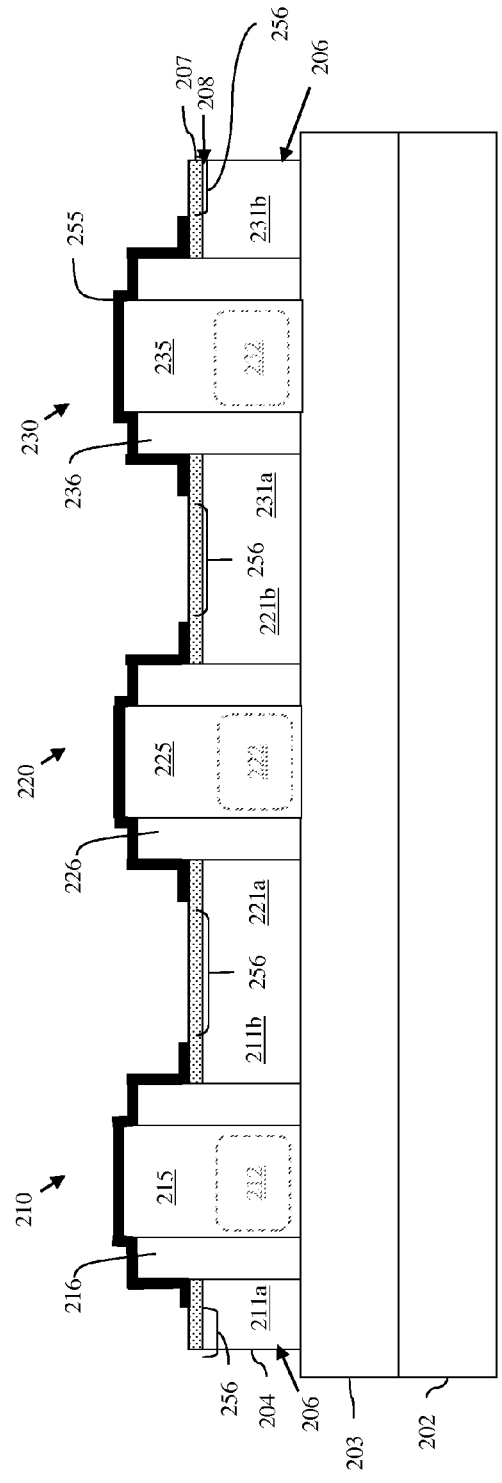
FIG. 23 is a schematic drawing illustrating a partially completed structure formed according to the method of FIG. 17.

Next, a conformal dielectric layer 255 can be deposited over the non-planar FETs 210, 220, 230 and, more particularly, over the gates 215, 225, 235 and across any exposed portions of the semiconductor fin 204 (1708, see FIG. 22). This conformal dielectric layer 255 can comprise an oxide material (e.g., SiO2), a nitride material (e.g., Si3N4), an oxynitride material (e.g., SiOxNy) or any other suitable dielectric material. Then, using conventional lithographic patterning techniques, openings 256 can be formed through the conformal dielectric layer 255 exposing the top surface 208 (or dielectric cap layer 207) and opposing sidewalls 209 of the semiconductor fin 204 at each end 206 (i.e., at the first and last source/drain regions 211a and 231b) and between any adjacent gates (e.g., between gates 215 and 225 at shared source/drain regions 211b/121a and between gates 225 and 235 at shared source/drain regions 221b/231a).

Figure 24:
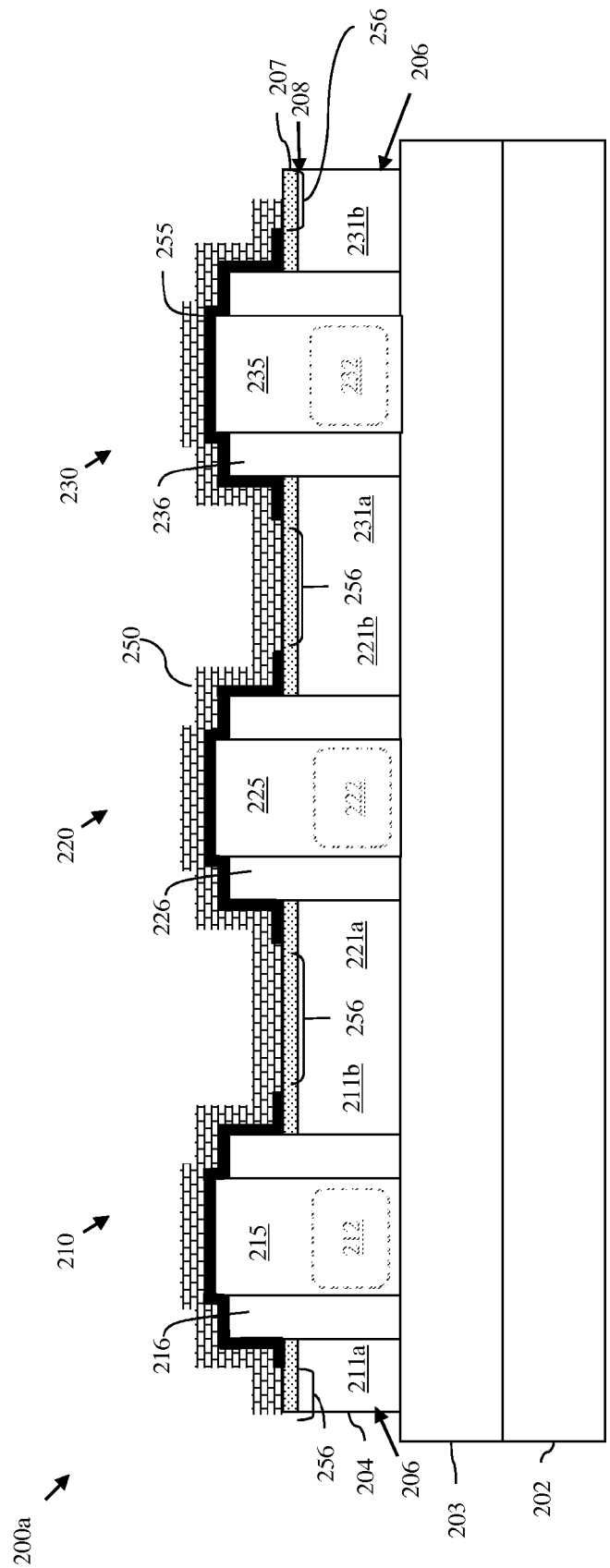
FIG. 24 is a schematic drawing illustrating a partially completed structure formed according to the method of FIG. 17.

Then, a conformal conductive layer 250 having a desired resistance can be formed over the non-planar FETs 210, 220, 230 such that it is electrically isolated from the gates 215, 225, 135 by the conformal dielectric layer 255 and any gate sidewall spacers 216, 126, 236 and further such that it contacts the exposed portions of the semiconductor fin 204 and, thereby the first and last source/drain regions 211a and 231b and the shared source/drain regions 211b/221a and 221b/231a, through the openings 256 (1712, see FIG. 24). This conformal conductive layer 250 should be formed at process 1712 such that it comprises a conductive material that will have a higher electrical resistance than the channel regions 212, 222, 232 of the series-connected FETs 210, 120, 230, when the FETs 210, 220, 1230 are in the "on" state, but a lower electrical resistance than the channel regions 212, 222, 232 when the FETs 210, 220, 230 are in the "off" state. Those skilled in the art will recognize that the "on" state refers to a state when the gate voltage minus the source voltage is approximately one volt or more above the threshold voltage for the FETs 210, 220, 230 and that the "off" state refers to a state when the gate voltage is equal to the source voltage.

For example, in one method embodiment, a polysilicon material can be deposited and either in-situ doped or subsequently implanted with a sufficient concentration of an n-type or p-type dopant in order to achieve the desired resistance. For example, if the FETs 210, 220, 230 comprise n-type FETs with source and drain regions 211a-b, 221a-b, 231a-b that are heavily doped with an n-type conductivity dopant (e.g., a Group V dopant, such as arsenic (As), phosphorous (P) or antimony (Sb)), then a conformal layer of polysilicon can be deposited and either in-situ doped or subsequently implanted with a lesser concentration of the same or a different n-type conductivity dopant. Conversely, if the FETs 210, 220, 130 comprise p-type FETs with source and drain regions 211a-b, 221a-b, 231a-b that are heavily doped with a p-type conductivity dopant (e.g., a Group III dopant, such as boron (B)), then a conformal layer of polysilicon can be deposited and either in-situ doped or subsequently implanted with a lesser concentration of the same or a different p-type conductivity dopant. In alternative method embodiments, a conformal metal layer can be deposited. This metal layer can be either preselected for its resistance or subsequently infused with a species in order to achieve the desired resistance (e.g., as shown in U.S. Pat. No. 7,314,786 of Yang et al., issued on Jan. 1, 2008, assigned to International Business Machines Corporation, and incorporated herein by reference).

After the conformal conductive layer 250 is formed at process 1712, additional processing necessary to complete the devices 200a or 200b can be performed (1714, see FIGS. 3A and 3B). Such processing can include, but is not limited to, the following: depositing and planarizing an inter-layer dielectric (ILD) 280; forming vias (i.e., contacts) to each end of the semiconductor fin 204 (e.g., forming a first via 261 that contacts the conformal conductive layer 250 and a first source/drain region 211a of a first FET 210 in the series and forming a second via 262 that contacts the conformal conductive layer 250 and a last source/drain region 231b of a last FET 230 in the series); and electrically connecting the first via 261 to a first supply voltage 217 (e.g., Vdd) and the second via 262 to a second supply voltage 218 different from said first supply voltage (e.g., Vss).

It should be understood that the corresponding structures, materials, acts, and equivalents of all means or step plus function elements in the claims below are intended to include any structure, material, or act for performing the function in combination with other claimed elements as specifically claimed. Additionally, it should be understood that the above-description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. Well-known components and processing techniques are omitted in the above-description so as to not unnecessarily obscure the embodiments of the invention.

Finally, it should also be understood that the terminology used in the above-description is for the purpose of describing particular embodiments only and is not intended to be limiting of the invention. For example, as used herein, the singular forms "a", "an" and "the" are intended to include the plural forms as well, unless the context clearly indicates otherwise. Furthermore, as used herein, the terms "comprises", "comprising," and/or "incorporating" when used in this specification, specify the presence of stated features, integers, steps, operations, elements, and/or components, but do not preclude the presence or addition of one or more other features, integers, steps, operations, elements, components, and/or groups thereof.

Therefore, disclosed above are embodiments of an integrated circuit device, e.g., a radio frequency (RF) switch, having series-connected planar or non-planar field effect transistors (FETs) with integrated voltage equalization rather than a discrete voltage distribution network. The series-connected FETs comprise gates positioned along a semiconductor body (e.g., along a semiconductor layer for series-connected planar FETs or a semiconductor fin for series-connected non-planar FETs) to define the channel regions for the series-connected FETs. Source/drain regions are located within the semiconductor body on opposing sides of the channel regions such that each portion of the semiconductor body between adjacent gates comprises one source/drain region for one field effect transistor abutting another source/drain region for another field effect transistor. Integrated voltage equalization is achieved through a conformal conductive layer having a desired resistance and positioned over the series-connected FETs such that it is electrically isolated from the gates, but in contact with the source/drain regions within the semiconductor body. This integrated voltage equalization introduces only a minimal amount of capacitance, provides a superior resistance on (Ron) versus impedance off (Zoff) and, thus, avoids or at least minimizes degradation of off-state isolation. Also, disclosed herein are embodiments of an associated method of forming such a device.

What is claimed is:

1. A device comprising:
a semiconductor layer;
multiple gates on said semiconductor layer, said gates defining channel regions in said semiconductor layer for multiple planar field effect transistors connected in a series;
gate sidewall spacers adjacent to said gates;
source/drain regions within said semiconductor layer on opposing sides of each of said channel regions such that each portion of said semiconductor layer between adjacent gates comprises one source/drain region for one field effect transistor abutting another source/drain region for another field effect transistor; and
a conformal conductive layer above said multiple planar field effect transistors, said conformal conductive layer conformally covering said source/drain regions, said gate sidewall spacers and said gates, being electrically isolated from said gates, and being in contact with said source/drain regions,
said conformal conductive layer comprising a conductive material having a higher resistance than said channel regions when said multiple planar field effect transistors are in an "on" state and a lower resistance than said channel regions when said multiple planar field effect transistors are in an "off" state.

2. The device of claim 1, said conformal conductive layer comprising any one of a polysilicon layer doped with a same type dopant as said source/drain regions and a metal layer.

3. The device of claim 1, further comprising, for each gate,
a dielectric cap layer on a top surface of said gate; and
dielectric spacers positioned laterally immediately adjacent to said gate, said dielectric cap layer and said dielectric spacers electrically isolating said gate from said conformal conductive layer.

4. A device comprising:
a semiconductor layer;
multiple gates on said semiconductor layer, said gates defining channel regions in said semiconductor layer for multiple planar field effect transistors connected in a series;
gate sidewall spacers adjacent to said gates;
source/drain regions within said semiconductor layer on opposing sides of each of said channel regions such that each portion of said semiconductor layer between adjacent gates comprises one source/drain region for one field effect transistor abutting another source/drain region for another field effect transistor;
a conformal conductive layer above said multiple planar field effect transistors, said conformal conductive layer conformally covering said source/drain regions, said gate sidewall spacers and said gates, being electrically isolated from said gates, and being in contact with said source/drain regions; and
a conformal dielectric layer electrically isolating said gates from said conformal conductive layer, said conformal dielectric layer having, at opposing ends of said semiconductor layer and between any adjacent gates, openings through which said conformal conductive layer contacts said semiconductor layer.

5. The device of claim 1, further comprising:
a first via electrically connecting both said conformal conductive layer and a first source/drain region of a first field effect transistor in said series to a first supply voltage; and
a second via electrically connecting both said conformal conductive layer and a last source/drain region of a last field effect transistor in said series to a second supply voltage different from said first supply voltage.

6. A device comprising:
an isolation layer;
a semiconductor fin on said isolation layer;
multiple gates on said semiconductor fin, said gates defining channel regions in said semiconductor fin for multiple non-planar field effect transistors connected in a series;
gate sidewall spacers adjacent to said gates;
source/drain regions within said semiconductor fin on opposing sides of each of said channel regions such that each portion of said semiconductor fin between adjacent gates comprises one source/drain region for one field effect transistor abutting another source/drain region for another field effect transistor; and a conformal conductive layer over said multiple non-planar field effect transistors, said conformal conductive layer conformally covering said source/drain regions, said gate sidewall spacers and said gates, being electrically isolated from said gates, and being in contact with said source/drain regions, said conformal conductive layer comprising a conductive material having a higher resistance than said channel regions when said multiple non-planar field effect transistors are in an "on" state and a lower resistance than said channel regions when said multiple non-planar field effect transistors are in an "off" state.

7. The device of claim 6, said conformal conductive layer comprising any one of a polysilicon layer doped with a same type dopant as said source/drain regions and a metal layer.

8. The device of claim 6, said non-planar field effect transistors comprising fin-type field effect transistors and said device further comprising:

a dielectric cap layer on a top surface of said semiconductor fin; and a conformal dielectric layer electrically isolating said gates from said conformal conductive layer, said conformal dielectric layer having, at opposing ends of said semiconductor fin and between any adjacent gates, openings through which said conformal conductive layer contacts said semiconductor fin.

9. The device of claim 6 further comprising:

a first via electrically connecting both said conformal conductive layer and a first source/drain region of a first field effect transistor in said series to a first supply voltage; and a second via electrically connecting both said conformal conductive layer and a last source/drain region of a last field effect transistor in said series to a second supply voltage different from said first supply voltage.

10. A device comprising:

an isolation layer;

a semiconductor fin on said isolation layer;

multiple gates on said semiconductor fin, said gates defining channel regions in said semiconductor fin for multiple non-planar field effect transistors connected in a series;

gate sidewall spacers adjacent to said gates;

source/drain regions within said semiconductor fin on opposing sides of each of said channel regions such that each portion of said semiconductor fin between adjacent gates comprises one source/drain region for one field effect transistor abutting another source/drain region for another field effect transistor;

a conformal conductive layer over said multiple non-planar field effect transistors, said conformal conductive layer conformally covering said source/drain regions, said gate sidewall spacers and said gates, being electrically isolated from said gates, and being in contact with said source/drain regions; and a non-planar field effect transistors comprising tri-gate field effect transistors and said device further comprising a conformal dielectric layer over said gates so as to electrically isolate said gates from said conformal conductive layer, said conformal dielectric layer having, at opposing ends of said semiconductor fin and between any adjacent gates, openings through which said conformal conductive layer contacts said semiconductor fin.

11. A device comprising:

a semiconductor layer;

multiple gates on said semiconductor layer, said gates defining channel regions in said semiconductor layer for multiple planar field effect transistors connected in a series;

source/drain regions within said semiconductor layer on opposing sides of each of said channel regions such that each portion of said semiconductor layer between adjacent gates comprises one source/drain region for one field effect transistor abutting another source/drain region for another field effect transistor; and a conformal conductive layer above said multiple planar field effect transistors, electrically isolated from said gates, and in contact with said source/drain regions, said conformal conductive layer comprising a conductive material having a higher resistance than said channel regions when said multiple planar field effect transistors are in an "on" state and a lower resistance than said channel regions when said multiple planar field effect transistors are in an "off" state.

12. The device of claim 11, said conformal conductive layer comprising any one of a polysilicon layer doped with a same type dopant as said source/drain regions and a metal layer.

13. The device of claim 11, further comprising, for each gate, a dielectric cap layer on a top surface of said gate; and dielectric spacers positioned laterally immediately adjacent to said gate, said dielectric cap layer and said dielectric spacers electrically isolating said gate from said conformal conductive layer.

14. The device of claim 11, further comprising a conformal dielectric layer electrically isolating said gates from said conformal conductive layer, said conformal dielectric layer having, at opposing ends of said semiconductor layer and between any adjacent gates, openings through which said conformal conductive layer contacts said semiconductor layer.

15. The device of claim 11, further comprising:

a first via electrically connecting both said conformal conductive layer and a first source/drain region of a first field effect transistor in said series to a first supply voltage; and a second via electrically connecting both said conformal conductive layer and a last source/drain region of a last field effect transistor in said series to a second supply voltage different from said first supply voltage.

16. A device comprising:

an isolation layer;

a semiconductor fin on said isolation layer;

multiple gates on said semiconductor fin, said gates defining channel regions in said semiconductor fin for multiple non-planar field effect transistors connected in a series;

source/drain regions within said semiconductor fin on opposing sides of each of said channel regions such that each portion of said semiconductor fin between adjacent gates comprises one source/drain region for one field effect transistor abutting another source/drain region for another field effect transistor; and a conformal conductive layer over said multiple non-planar field effect transistors, electrically isolated from said gates, and in contact with said source/drain regions, said conformal conductive layer comprising a conductive material having a higher resistance than said channel regions when said multiple non-planar field effect transistors are in an "on" state and a lower resistance than said channel regions when said multiple non-planar field effect transistors are in an "off" state.

17. The device of claim 16, said conformal conductive layer comprising any one of a polysilicon layer doped with a same type dopant as said source/drain regions and a metal layer.

18. The device of claim 16, said non-planar field effect transistors comprising fin-type field effect transistors and said device further comprising:
- a dielectric cap layer on a top surface of said semiconductor fin; and
- a conformal dielectric layer electrically isolating said gates from said conformal conductive layer, said conformal dielectric layer having, at opposing ends of said semiconductor fin and between any adjacent gates, openings through which said conformal conductive layer contacts said semiconductor fin.

19. The device of claim 16, said non-planar field effect transistors comprising tri-gate field effect transistors and said device further comprising a conformal dielectric layer over said gates so as to electrically isolate said gates from said conformal conductive layer, said conformal dielectric layer having, at opposing ends of said semiconductor fin and between any adjacent gates, openings through which said conformal conductive layer contacts said semiconductor fin.

20. The device of claim 16, further comprising:
- a first via electrically connecting both said conformal conductive layer and a first source/drain region of a first field effect transistor in said series to a first supply voltage; and
- a second via electrically connecting both said conformal conductive layer and a last source/drain region of a last field effect transistor in said series to a second supply voltage different from said first supply voltage.

* * * * *